(12) United States Patent
Nagaoka et al.

(10) Patent No.: US 7,977,751 B2
(45) Date of Patent: Jul. 12, 2011

(54) INSULATED GATE FIELD EFFECT TRANSISTOR AND A METHOD OF MANUFACTURING THE SAME

(75) Inventors: Kojiro Nagaoka, Kanagawa (JP); Yoshihiko Nagahama, Kanagawa (JP)

(73) Assignee: Sony Corporation, Tokyo (JP)

( * ) Notice: Subject to any disclaimer, the term of this patent is extended or adjusted under 35 U.S.C. 154(b) by 554 days.

(21) Appl. No.: 12/025,965

(22) Filed: Feb. 5, 2008

(65) Prior Publication Data
US 2008/0185637 A1    Aug. 7, 2008

(30) Foreign Application Priority Data

Feb. 6, 2007  (JP) ................... 2007-026918
May 18, 2007  (JP) ................... 2007-132364

(51) Int. Cl.
*H01L 29/76* (2006.01)
(52) U.S. Cl. ................. 257/365; 257/E29.158
(58) Field of Classification Search .............. 257/365, 257/E27.06, E29.158
See application file for complete search history.

(56) References Cited

U.S. PATENT DOCUMENTS

| | | | |
|---|---|---|---|
| 6,448,163 B1* | 9/2002 | Holbrook et al. | 438/585 |
| 2002/0153537 A1* | 10/2002 | Segawa | 257/202 |
| 2003/0003666 A1* | 1/2003 | Iriyama et al. | 438/275 |

FOREIGN PATENT DOCUMENTS

| | | |
|---|---|---|
| JP | 11-243150 | 9/1999 |
| JP | 2000-332237 | 11/2000 |
| JP | 2001-085677 | 3/2001 |
| JP | 2001-127288 | 5/2001 |
| JP | 2001-274380 | 10/2001 |
| JP | 2005-136366 | 5/2005 |
| WO | 01/71807 | 9/2001 |

OTHER PUBLICATIONS

Atsushi Yagishita et al.; High Performance Metal Gate MOSFETs Fabricated by CMP for 0.1um Regime; International Electron Devices Meeting 1998; Technical Digest pp. 785-788 (1988).
Japanese Office Action issued on May 7, 2009 corresponding to JP Application No. 2007-132364.

* cited by examiner

*Primary Examiner* — Thomas L. Dickey
(74) *Attorney, Agent, or Firm* — SNR Denton US LLP

(57) ABSTRACT

Disclosed herein is an insulated gate field effect transistor including: (A) a source/drain region and a channel formation region; (B) a gate electrode formed above the channel formation region; and (C) a gate insulating film; wherein the gate insulating film is composed of a gate insulating film main body portion formed between the gate electrode and the channel formation region, and a gate insulating film extension portion extending from the insulating film main body portion to a middle of a side surface portion of the gate electrode, and when a height of the gate electrode is $H_{Gate}$ and a height of the gate insulating film extension portion is $H_{Ins}$ with a surface of the channel formation region as a reference, a relationship of $H_{Ins} < H_{Gate}$ is fulfilled.

11 Claims, 23 Drawing Sheets

12

[PROCESS-100]

[PROCESS-100]

[PROCESS-100]

[PROCESS-110]

[PROCESS-120]

[PROCESS-130]

[PROCESS-130]

[PROCESS-130]

[PROCESS-140]

[PROCESS-140]

[PROCESS-150]

[PROCESS-160]

[PROCESS-180]

[PROCESS-210]

[PROCESS-210]

[PROCESS-310]

[PROCESS-320]

[PROCESS-320]

[PROCESS-320]

[PROCESS-400]

[PROCESS-400]

[PROCESS-410]

[PROCESS-420]

[PROCESS-430]

[PROCESS-510]

[PROCESS-510]

[PROCESS-540]

[PROCESS-20]

[PROCESS-30]

[PROCESS-40]

[PROCESS-50]

[PROCESS-50]

[PROCESS-60]

[PROCESS-70]

[PROCESS-70]

INSULATED GATE FIELD EFFECT TRANSISTOR AND A METHOD OF MANUFACTURING THE SAME

CROSS REFERENCES TO RELATED APPLICATIONS

The present invention contains subject matter related to Japanese Patent Application JP 2007-026918 and JP 2007-132364 filed in the Japan Patent Office on Feb. 6, 2007 and May 18, 2007, respectively, the entire contents of which being incorporated herein by reference.

BACKGROUND OF THE INVENTION

1. Field of the Invention

The present invention relates to an insulated gate field effect transistor (FET) and a method of manufacturing the same.

2. Description of the Related Art

At the present time, high integration and an improvement in an operating speed of a semiconductor device are made by miniaturizing a transistor in accordance with the so-called scaling law. When an insulated gate field effect transistor (Metal Insulator Semiconductor FET (MISFET)) is desired to be miniaturized, it is necessary to suppress an influence of the so-called short channel effect. Depletion of a gate electrode as one factor of the short channel effect can not be effectively suppressed as long as the gate electrode is made of a semiconductor material. In order to cope with this situation, it is proposed that the gate electrode is made of a conductive material such as a metal or a metallic compound. With regard to a technique for making a gate electrode of a conductive material, there is proposed a method in which a metallic film, for example, is deposited instead of depositing a polycrystalline silicon film, and the resulting metallic film is patterned similarly to the case of the related art, thereby forming a gate electrode. In addition thereto, there is also proposed a method in which a gate electrode is formed by carrying out the so-called damascene process for filling a conductive material in an opening portion for gate electrode formation. This method, for example, is described in Non-Patent Document 1 of Atsushi Yagishita et al.: "High Performance Metal Gate MOSFETs Fabricated by CMP for 0.1 μm Regime," International Electron Devices Meeting 1998 Technical Digest pp. 785 to 788 (1998). With the method in which the gate electrode is formed by carrying out the damascene process, a gate insulating film, for example, made of an insulating material (such as a hafnium oxide) having a larger relative permittivity than that of a silicon oxide is formed within an opening portion for gate electrode formation which is formed by removing a dummy gate electrode, and the gate electrode is then formed. As a result, it is possible to improve the characteristics of the insulated gate field effect transistor.

In addition, for the purpose of achieving a balance between optimization of a work function of a gate electrode and a low resistance promotion for the gate electrode, the following method is also proposed. That is to say, when the gate electrode is intended to be formed by carrying out the damascene process, firstly, a thin film first layer (work function controlling layer) made of a conductive material having a suitable work function is formed within an opening portion for gate electrode formation. Next, a second layer made of another conductive material having a smaller resistivity (specific resistance) than that of the conductive material of the first layer is formed, thereby structuring the gate electrode.

An alignment safety margin when contact plugs to be connected to a top surface of a gate electrode and a source/drain region, respectively, are formed in an interlayer insulating layer covering the gate electrode and the source/drain region is reduced along with the miniaturization of the insulated gate field effect transistor. For this reason, it is preferable to simultaneously form those contact plugs by carrying out a series of processes. After formation of an opening portion for contact plug formation having a bottom portion to which the top surface of the gate electrode is exposed, and formation of an opening portion for contact plug formation having a bottom surface to which the source/drain region is exposed, a conductive material such as tungsten is filled in each of those opening portions for contact plug formation, thereby forming the contact plugs. Those opening portions for contact plug formation are formed by utilizing the well known lithography technique and etching technique.

Hereinafter, an outline of a method of forming a gate electrode by carrying out a damascene process in the related art will be described with reference to FIG. 1C, and FIGS. 6A to 6H as schematically partial end views of a silicon semiconductor substrate and the like.

[Process-10]

Firstly, a base 10 including a channel formation region 12, a source/drain region 13, a lower insulating layer 21 made of $SiO_2$, and an opening portion 22 for gate electrode formation formed above the channel formation region 12 is prepared (refer to FIG. 1C).

It is to be noted that a method of manufacturing the base 10 will be described in detail later in Embodiment 1. In addition, in FIG. 1C, reference numeral 11 designates a silicon semiconductor substrate, reference symbol 13A designates a silicide layer formed in a portion overlying the source/drain region 13, and reference numeral 17 designates an offset spacer made of SiN. Also, reference numeral 18 designates a first sidewall made of $SiO_2$, reference numeral 19 designates a second sidewall made of SiN, and reference numeral 20 designates a stress liner layer made of SiN.

[Process-20]

Next, a gate insulating film 630, for example, made of a hafnium oxide, a thin film first layer (work function controlling layer) 631 made of a metallic material (hafnium silicide) for regulating a work function of a gate electrode, and a barrier layer 632A made of TiN are formed in order over the entire surface of the base 10 (refer to FIG. 6A).

[Process-30]

After that time, after a second layer 632 made of tungsten is formed over the entire surface of the base 10 by utilizing a so-called blanket tungsten CVD method, a flattening treatment is carried out by utilizing a CMP method. As a result, the second layer 632, the barrier layer 632A, the first layer 631, and the gate insulating film 630 which overlie a lower insulating layer 21, the offset spacer 17, the first sidewall 18 and the second sidewall 19 are removed (refer to FIG. 6B). In such a manner, a gate electrode 623 can be obtained. Here, the gate electrode 623 is formed above the channel formation region 12 through the gate insulating film 630. Also, the gate electrode 623 is composed of the first layer 631, the barrier layer 632A, and the second layer 632. In addition, the gate insulating film 630 is formed so as to extend from a surface of the semiconductor substrate 11 to a sidewall of the opening portion 22 for gate electrode formation.

[Process-40]

Next, an interlayer insulating layer 34 is formed over the entire surface of the base 10 (refer to FIG. 6C).

[Process-50]

After that, opening portions 35A and 35B for contact plug formation are formed in a portion of the interlayer insulating layer 34 located above the gate electrode 623, and a portion of the lower insulating layer 21 located above the source/drain region 13, respectively. Note that, FIG. 6D shows a state at a time point when formation of the opening portion 35A for contact plug formation is completed and the opening portion 35B for contact plug formation is in the middle of formation, and FIG. 6E shows a state at a time point when formation of the opening portion 35B for contact plug formation is completed. Here, although a resist layer for etching is actually formed, an illustration of such a resist layer is omitted here for the sake of simplicity.

[Process-60]

Next, in order to form contact plugs, a pretreatment for removing a natural oxide film or the like is carried out. FIG. 6F shows a state at a time point when the pretreatment is completed.

[Process-70]

After that time, after a second barrier layer 36 made of Ti (lower layer)/TiN (upper layer) is formed (refer to FIG. 6G), and a tungsten layer is formed over the entire surface of the base 10 by utilizing the blanket tungsten CVD method, the flattening treatment is carried out by utilizing the CMP method. As a result, contact plugs 37A and 37B can be formed within the opening portions 35A and 35B for contact plug formation, respectively (refer to FIG. 6H).

SUMMARY OF THE INVENTION

Now, in the insulated gate field effect transistor manufactured by carrying out such a manufacturing method, the upper end surfaces of the gate insulating film 630 and the first layer 631 are exposed in [Process-30] (refer to FIG. 6B). Therefore, in [Process-50], in order to form the opening portions 35A and 35B for contact plug formation, the interlayer insulating layer 34 made of SiO$_2$ is dry-etched (refer to FIG. 6D), and subsequently the lower insulating layer 21 made of SiO$_2$ and the stress liner layer 20 made of SiN are dry-etched (refer to FIG. 6E). However, the gate insulating film 630, or the gate insulating film 630 and the first layer 631 which are exposed to the top surface of the gate electrode 623 are etched depending on the conditions of the dry etching. Moreover, the first layer 631 is etched depending on the conditions of the pretreatment in [-60].

In addition, as the case may be, in order to form the stress liner layer again, continuously to [Process-30] (refer to FIG. 6B), the lower insulating layer 21 made of SiO$_2$ may be removed by using a dilute hydrofluoric acid. However, the first layer 631 made of hafnium silicide is etched by using the dilute hydrofluoric acid. It is to be noted that in the wet etching using the dilute hydrofluoric acid, normally, no gate insulating film 630 made of the hafnium oxide is etched.

Or, a laminated structure in which a lower interlayer insulating layer made of SiN, and an interlayer insulating layer made of SiO$_2$ are laminated from a downside is demanded as a layer structure of the interlayer insulating layer to be formed in a semiconductor element region (not shown) in some cases. In such cases, the structure of the insulating layer/the interlayer insulating layer formed above the source/drain region 13 has a four-layer structure having the stress liner layer 20 made of SiN, the lower layer insulating layer 21 made of SiO$_2$, the lower interlayer insulating layer made of SiN, and the upper interlayer insulating layer made of SiO$_2$ which are formed in this order from the downside. On the other hand, the structure of the interlayer insulating layer formed above the gate electrode 623 has a two-layer structure having the lower interlayer insulating layer made of SiN, and the upper interlayer insulating layer made of SiO$_2$ from the downside. Therefore, in the same process as that of [Process-50] described above, when the opening portions 35A and 35B for contact plug formation are formed in the portion of the insulating layer 34 located above the gate electrode 623, and in the portion of the interlayer insulating layer located above the source/drain region 13, respectively, by utilizing the photolithography technique and the dry etching technique, for the upside of the gate electrode 623, it is necessary to etch the two-layer structure having the upper interlayer insulating layer made of SiO$_2$, and the lower interlayer insulating layer made of SiN. On the other hand, for the upside of the source/drain region 13, it is necessary to etch the four-layer structure having the upper interlayer insulating layer made of SiO$_2$, the lower interlayer insulating layer made of SiN, the lower insulating layer 21 made of SiO$_2$, and the stress liner layer 20 made of SiN. As a result, there is caused such a problem that the etching conditions become very complicated, and the etching selectivity can not be sufficiently obtained.

Thus, when the interlayer insulating layers made of SiN and SiO$_2$, respectively, are formed over the entire surface of the base 10 after the lower insulating layer 21 made of SiO$_2$ is removed by using the dilute hydrofluoric acid continuously to [Process-30] (refer to FIG. 6B), even for the upside of the gate electrode 623 as well as even for the source/drain region 13, all that is demanded is that the two-layer structure having the upper interlayer insulating layer made of SiO$_2$, and the lower interlayer insulating layer made of SiN (and moreover the stress liner layer 20 made of SiN for the upside of the source/drain region 13) is etched. As a result, it is possible to avoid such a problem that the etching conditions become very complicated, and the etching selectivity can not be sufficiently obtained. However, there is caused the same problem as that of the foregoing that since the lower insulating layer 21 made of SiO$_2$ is removed by using the dilute hydrofluoric acid, the first layer 631 made of hafnium silicide is etched.

As the result of the foregoing, it is easy to cause such a problem that the first layer 631 or the gate insulating film 630 in the vicinity of the surface of the semiconductor substrate 11 is thinned (refer to a region surrounded by a circular mark in FIG. 6F) or is eliminated. In addition, when the first layer 631 in the vicinity of the surface of the semiconductor substrate 11 is thinned, a difference in work function between the gate electrode in the n-channel insulated gate field effect transistor and the gate electrode in the p-channel insulated gate field effect transistor is also eliminated or becomes less. In addition, if such a situation is provided, when the contact plug 37A is formed in [Process-70], a void occurs in the contact plug 37A. Thus, an electrical resistance value of the contact plug 37A increases, or a thickness of the gate insulating film 630 is thinned. As a result, it is easy to deteriorate the withstand voltage. Moreover, the material of the portion, located above the gate electrode 623, which is to be etched for the purpose of forming the opening portion 35A for contact plug formation is different from that of the portion, located above the source/drain region 13, which is to be etched for the purpose of forming the opening portion 35B for contact plug formation. Therefore, there is also encountered such a problem that it is difficult to optimize the formation conditions for the opening portions 35A and 35B for contact plug formation.

In the light of the foregoing, it is therefore desirable to provide an insulated gate field effect transistor having a gate electrode which has high reliability without etching any of materials of a gate insulating film and a gate electrode when a contact plug is formed above the gate electrode, and a method of manufacturing the same.

In order to attain the desire described above, according to an embodiment of the present invention, there is provided an insulated gate field effect transistor including:

(A) a source/drain region and a channel formation region;
(B) a gate electrode formed above the channel formation region; and
(C) a gate insulating film;

in which the gate insulating film is composed of a gate insulating film main body portion formed between the gate electrode and the channel formation region, and a gate insulating film extension portion extending from the gate insulating film main body portion to a middle of a side surface portion of the gate electrode, and when a height of the gate electrode is $H_{Gate}$ and a height of the gate insulating film extension portion is $H_{Ins}$ with a surface of the channel formation region as a reference, a relationship of $H_{Ins} < H_{Gate}$ is fulfilled.

When the gate electrode is composed of a first layer made of a first metallic material, a second layer made of a second metallic material different from the first metallic material, and a third layer made of a third metallic material different from the first metallic material, the first layer is preferably made of a metallic material for regulating a work function of the gate electrode (specifically, a metallic material having a preferable work function in a relationship with the channel formation region of an n-channel or p-channel insulated gate field effect transistor may be suitably selected as the metallic material of the first layer, and this also applies the following description). More specifically, the first layer is preferably made of a metal selected from a group including hafnium, tantalum, titanium, molybdenum, ruthenium, nickel, and platinum, an alloy thereof, or a compound thereof (such as a metallic nitride or a metallic silicide as a compound of a metal and a semiconductor material). In addition, the second layer is preferably made of a metal selected from a group including tungsten (W), tantalum (Ta), titanium (Ti), copper (Cu), and aluminum (Al), or an alloy thereof. Also, the third layer is preferably made of a metal selected from the group including tungsten (W), copper (Cu), and aluminum (Al), or an alloy thereof. More specifically, when the channel formation region is of an n-type, a metal selected from the group including hafnium (Hf), tantalum (Ta), and the like, an alloy thereof, or a compound thereof can be selected as the material of which the first layer is made. On the other hand, when the channel formation region is of a p-type, a metal selected from the group including titanium (Ti), molybdenum (Mo), ruthenium (Ru), nickel (Ni), and platinum (Pt), an alloy thereof, or a compound thereof can be selected as the material of which the first layer is made. However, the present invention is not intended to be limited thereto. Alternatively, the first layer is preferably made of a metal selected from the group including hafnium, tantalum, titanium, tungsten, molybdenum, ruthenium, nickel, and platinum, an alloy thereof, or a compound thereof (such as a metallic nitride or a metallic silicide as a compound of a metal and a semiconductor material). In addition, the second layer is preferably made of silicide (specifically, for example, tri-nickel silicide [$Ni_3Si$]).

Alternatively, in the insulated gate field effect transistor according to the embodiment of the present invention, the gate electrode can be made of silicide (specifically, for example, nickel di-silicide [$NiSi_2$] or nickel silicide [NiSi] in the case of the n-channel insulated gate field effect transistor, and tri-nickel silicide [$Ni_3Si$] in the case of the p-channel insulated gate field effect transistor).

According to another embodiment of the present invention, there is provided an insulated gate field effect transistor including:

(A) a source/drain region and a channel formation region;
(B) a gate electrode formed above the channel formation region; and
(C) a gate insulating film;

in which the gate insulating film is composed of a gate insulating film main body portion formed between the gate electrode and the channel formation region, and a gate insulating film extension portion extending from the gate insulating film main body portion to a top surface of the gate electrode, the gate electrode is composed of a first layer made of a first metallic material, a second layer made of a second metallic material different from the first metallic material, and a third layer made of a third metallic material different from the first metallic material, the first layer is formed so as to extend from a bottom surface portion of the gate electrode facing the channel formation region to a middle of a side surface portion of the gate electrode, the second layer and the third layer occupy a remaining portion of the gate electrode in a lamination state, and when a height of the gate electrode is $H_{Gate}$, a height of a portion of the first layer formed so as to extend to the middle of the side surface portion of the gate electrode is $H_{Mt-1}$, and a height of an interface between the second layer and the third layer is $H_{Mt-2}$ with a surface of the channel formation region as a reference, a relationship of $H_{Mt-1} < H_{Gate}$, $H_{Mt-2} < H_{Gate}$, and $H_{Mt-1} \approx H_{Mt-2}$ is fulfilled.

In the insulated gate field effect transistor according to another embodiment of the present invention, the first layer is preferably made of a metallic material for regulating a work function of the gate electrode. More specifically, the first layer is preferably made of a metal selected from a group including hafnium, tantalum, titanium, molybdenum, ruthenium, nickel, and platinum, an alloy thereof, or a compound thereof (such as a metallic nitride or a metallic silicide as a compound of a metal and a semiconductor material). In addition, the second layer is preferably made of a metal selected from a group including tungsten (W), tantalum (Ta), titanium (Ti), copper (Cu), and aluminum (Al), or an alloy thereof. Also, the third layer is preferably made of a metal selected from the group including tungsten (W), copper (Cu), and aluminum (Al), or an alloy thereof. More specifically, when the channel formation region is of an n-type, a metal selected from the group including hafnium (Hf), tantalum (Ta), and the like, an alloy thereof, or a compound thereof can be selected as the material of which the first layer is made. On the other hand, when the channel formation region is of a p-type, a metal selected from the group including titanium (Ti), molybdenum (Mo), ruthenium (Ru), nickel (Ni), platinum (Pt) and the like, an alloy thereof, or a compound thereof can be selected as the material of which the first layer is made. However, the present invention is not intended to be limited thereto.

According to still another embodiment of the present invention, there is provided a method of manufacturing an insulated gate field effect transistor including the steps of:

(a) preparing a base including a source/drain region and a channel formation region, an insulating layer, and an opening portion for gate electrode formation which is formed above the channel formation region;

(b) forming a gate insulating film on the channel formation region exposed to a bottom portion of the opening portion for gate electrode formation, and on a sidewall of the opening portion for gate electrode formation;

(c) selectively removing the gate insulating film formed on the sidewall of the opening portion for gate electrode formation, thereby obtaining the gate insulating film composed of a gate insulating film main body portion left on a bottom portion of the opening portion for gate electrode formation, and a gate insulating film extension portion extending from the gate insulating film main body portion to a middle of the sidewall of the opening portion for gate electrode formation; and (d) filling a metallic material in the opening portion for gate electrode formation, thereby obtaining the gate electrode.

According to yet another embodiment of the present invention, there is provided a method of manufacturing an insulated gate field effect transistor including the steps of:

(a) preparing a base including a source/drain region and a channel formation region, an insulating layer, and an opening portion for gate electrode formation which is formed above the channel formation region;

(b) forming a gate insulating film on the channel formation region exposed to a bottom portion of the opening portion for gate electrode formation, and on a sidewall of the opening portion for gate electrode formation; and (c) filling a metallic material in the opening portion for gate electrode formation, thereby obtaining the gate electrode;

in which the gate electrode is composed of a first layer made of a first metallic material, a second layer made of a second metallic material different from the first metallic material, and a third layer made of a third metallic material different from the first metallic material, and after the first layer formed so as to extend from a bottom surface portion of the gate electrode facing the channel formation region to a middle of a side surface portion of the gate electrode, and the second layer filled in a portion, within the opening portion for gate electrode formation, having the first layer formed therein are obtained in the step (c), the third metallic material is filled in a remaining portion of the opening portion for gate electrode formation, thereby obtaining a gate electrode composed of the first layer, the second layer, and the third layer.

In the method of manufacturing an insulated gate field effect transistor according to the still another embodiment or the yet another embodiment of the present invention, the first layer is preferably made of a metallic material for regulating a work function of the first layer. Or, in the method of manufacturing an insulated gate field effect transistor according to the still another embodiment or the yet another embodiment of the present invention, moreover, the first layer is preferably made of a metal selected from the group including hafnium, tantalum, titanium, molybdenum, ruthenium, nickel, and platinum, an alloy thereof, or a compound thereof (such as a metallic nitride or a metallic silicide as a compound of a metal and a semiconductor material). In addition, the second layer is preferably made of a metal selected from the group including tungsten (W), tantalum (Ta), titanium (Ti), copper (Cu), and aluminum (Al), or an alloy thereof. Also, the third layer is preferably made of a metal selected from the group including tungsten (W), copper (Cu), and aluminum (Al), or an alloy thereof. More specifically, when the channel formation region is of an n-type, a metal selected from the group including hafnium (Hf), tantalum (Ta), and the like, an alloy thereof, or a compound thereof can be selected as the material of which the first layer is made. On the other hand, when the channel formation region is of a p-type, a metal selected from the group including titanium (Ti), molybdenum (Mo), ruthenium (Ru), nickel (Ni), platinum (Pt), and the like, an alloy thereof, or a compound thereof can be selected as the material of which the first layer is made. However, the present invention is not intended to be limited thereto.

According to the still another embodiment of the present invention, various chemical vapor deposition (CVD) methods; various physical vapor deposition (PVD) methods such as an evaporation method such as an electron beam evaporation method or a heated filament evaporation method, a sputtering method, an ion plating method, and a laser ablation method; and a plating method such as an electrolytic plating method or a nonelectrolytic plating method can be given as a method of filling the second metallic material in the remaining portion of the opening portion for gate electrode formation, a method of filling an inner layer in the remaining portion of the opening portion for gate electrode formation, or a method of filling the third metallic material in the remaining portion of the opening portion for gate electrode formation. Any suitable one of these methods may be carried out by itself, or these methods may be carried out in suitable combination. After that time, preferably, a flattening treatment is carried out by utilizing the chemical mechanical polishing method (CMP method), the etch back method or the like.

In the method of manufacturing an insulated gate field effect transistor according to the still another embodiment of the present invention, a combination of the CVD method, the PVD method, and the etch back method, for example, can be given as a method of forming the conductive material layer. The CVD method or the PVD method can be given as a method of forming the metallic material layer over the entire surface of the base. Also, the heating treatment can be given as a method of chemically reacting the conductive material layer and the metallic material layer with each other. In addition, the wet etching method can be given as a method of removing the unreacted metallic material layer.

In the insulated gate field effect transistors according to the embodiments of the present invention, as described above, it is preferable that the interlayer insulating layer is formed over the entire surface of the base, and the contact plug connected to the top surface of the gate electrode is provided in a portion of the interlayer insulating layer located above the channel formation region. In addition, the side surface portion of the gate electrode preferably faces the sidewall. Also, the material of which at least a part of the sidewall is made is preferably different from that of which the interlayer insulating layer is made. With regard to the material of which a portion of the sidewall contacting the side surface portion of the gate electrode, specifically, SiN can be exemplified. In addition, with regard to the interlayer insulating layer, a single layer structure of an $SiO_2$ system material, or a lamination structure of an SiN system material and the $SiO_2$ system material. The top surface of the source/drain region is preferably formed from a silicide layer from a viewpoint of reduction of the contact resistance value. In addition, a stress liner layer, for example, made of SiN is preferably formed on the source/drain region. As a result, a stress can be applied to the channel formation region, thereby enhancing a driving ability of the insulated gate field effect transistor.

In addition, each of the methods of manufacturing an insulated gate field effect transistor according to the embodiments of the present invention, as described above, preferably further includes the steps of forming an opening portion for contact plug formation in a portion of an interlayer insulating layer located above the channel formation region by, for example, utilizing a photolithography technique and a dry etching technique after the interlayer insulating layer is formed over the entire surface of the base by utilizing any suitable one of various CVD methods such as a plasma CVD method, a high density plasma CVD method, and an atmospheric pressure CVD method, and filling a conductive material in the opening portion for contact plug formation by, example, utilizing the CVD method or the PVD method, thereby obtaining a contact plug connected to a top surface of the gate electrode. In addition, a lateral wall of the opening portion for gate electrode formation provided in the insulating layer is preferably constituted by a sidewall. A material of which at least a part of the sidewall is made is preferably different from that of which the interlayer insulating layer is made. With regard to a material of which a portion of the sidewall contacting the side surface portion of the gate electrode, specifically, SiN can be exemplified. A silicide layer is preferably formed on the top surface of the source/drain region by utilizing the well known method from a viewpoint of reduction of a contact resistance value. In addition, a stress liner layer, for example, made of SiN is preferably formed on the source/drain region by, for example, utilizing the CVD method. As a result, a stress can be applied to the channel formation region, thereby enhancing a driving ability of the insulated gate field effect transistor.

Here, it is important that after the opening portion for contact plug formation is formed in a portion of the interlayer insulating layer located above the channel formation region by, for example, utilizing the photolithography technique and the dry etching technique, the height, $H_{Ins}$, of the gate insulating film extension portion, and the height, $H_{Mt-1}$, of the portion of the first layer formed so as to extend to the middle of the side surface portion of the gate electrode are determined so as not to expose the gate insulating film and the first layer (work function controlling layer) to the bottom portion of the opening portion for contact plug formation.

In the insulated gate field effect transistors according to the embodiment and the another embodiment of the present invention, or the methods of manufacturing the same according to the still another embodiment and the yet another embodiment of the present invention, the well known method may be utilized as the method of preparing the base including the source/drain region and the channel formation region, the insulating layer, and the opening portion for gate electrode formation located above the channel formation region, that is, the method of manufacturing the base. In addition, with regard to the method of removing the gate insulating film formed on the sidewall of the opening portion for gate electrode formation, specifically, the dry etching method or the wet etching method can be given.

In addition to a semiconductor substrate such as a silicon semiconductor substrate, a supporting body (such as a glass substrate, a quartz substrate, a silicon semiconductor substrate having an insulating layer formed on its surface, a plastic substrate, or a plastic film) having a semiconductor layer formed on its surface can be exemplified as the base, including the source/drain region, the channel formation region and the like, which is used in each of the embodiments of the present invention. The insulated gate field effect transistor, for example, is formed in a well region or the like of a semiconductor substrate or a semiconductor layer. An isolation region, for example, structured in the form of a trench structure, a LOCOS structure, or a combination of the trench structure and the LOCOS structure may be formed between the adjacent insulated gate field effect transistors. Moreover, a base having an SOI structure obtained by utilizing an SIMOX method or a substrate sticking method may also be used. In this case, it is unnecessary to form the insulator region.

In addition to an $SiO_2$ system material, an SiOF system material or an SiN system material (such as SiN or SiON) which has been generally used heretofore, a so-called high relative permittivity material having a relative permittivity k ($=\epsilon/\epsilon_0$) of about 4.0 or more can be given as the material of which the gate insulating film is made. A metallic oxide film or a metallic nitride film such as a zirconium oxide ($ZrO_2$), a hafnium oxide ($HfO_2$), HfSiON, an aluminum oxide ($Al_2O_3$), a yttrium oxide ($Y_2O_3$), or a lanthanum oxide ($La_2O$) can be exemplified as the high relative permittivity material. The gate insulating film may be made of either one kind of material or plural kinds of materials. In addition, the gate insulating film may be formed in the form of either single film (containing a composite membrane made of plural materials) or a laminated film. The gate insulating film of the n-channel insulated gate field effect transistor, and the gate insulating film of the p-channel insulated gate field effect transistor may be made of either the same material or different materials, respectively. The gate insulating film can be generally formed by utilizing the well known method. In particular, an atomic layer deposition method (ALD method), a metal organic chemical vapor deposition method (MOCVD method), a sputtering method or the like can be exemplified as a method of forming the gate insulating film made of the high relative permittivity material described above.

While depending on the materials, the various CVD methods and the PVD methods containing the ALD method and the MOCVD method can be given as the method of forming the first layer (work function controlling layer). In addition, when the second layer is made of silicide, either the kinds and amount of impurities contained in silicide are controlled, or, for example, aluminum ions are suitably implanted into silicide, thereby making it possible to optimize values of the work functions of the gate electrodes of the n-channel insulated gate field effect transistor and the p-channel insulated gate field effect transistor.

In addition to the $SiO_2$ system material and SiN system material described above, an SiOF system material, SiC and a low relative permittivity insulating material, such as an organic SOG, a polyimide system resin or a fluorine system resin, having a relative permittivity k ($=\epsilon/\epsilon_0$) of 3.5 or less for example (for example, fluorocarbon, amorphous tetrafluoroethylene, polyarylether, aryletherfluoride, polyimide fluoride, parylene, benzocyclobutene, amorphous carbon, cycloperfluorocarbon polymer, or fullerene fluoride) can be given as the materials of which the insulating layer and the interlayer insulating layer are made, respectively. Or, each of the insulating layer and the interlayer insulating layer can also be structured in the form of a laminated structure of these materials. While depending on the materials, the CVD method and the PVD method can be given as the method of forming each of the insulating layer and the interlayer insulating layer. It is to be noted that the sidewall described above is included in the insulating layer.

Polycrystalline silicon doped with an impurity, or a high melting point metal material such as tungsten (W) can be given as the material of which the contact plug provided in the interlayer insulating layer is made. The material described above is filled in the opening portion for contact plug formation by utilizing the well known method after the opening portion for contact plug formation is formed in the interlayer insulating layer by utilizing the dry etching method or the like such as the RIE method, thereby making it possible to form the contact plug. Specifically, for example, tungsten is filled in the opening portion for contact plug formation by utilizing the blanket tungsten CVD method, and the excessive tungsten layer on the interlayer insulating layer is then removed, thereby making it possible to form the contact plug. Note that, it is preferable that tungsten is filled in the opening portion for contact plug formation by utilizing the blanket tungsten CVD method after a Ti layer and a TiN layer as adherence layers are formed in the opening portion for contact plug formation.

In the embodiments of the present invention, the term of "the channel formation region" means a region in which a channel can be formed, and thus does not mean only a region in which a channel is actually formed. For example, a portion of the semiconductor layer or the semiconductor substrate which is located so as to face the gate electrode corresponds to "the channel formation region." For example, a CMOS semiconductor device composed of an NMOS and a PMOS can be given as a semiconductor device in which the insulated gate field effect transistor according to any of the embodiments of the present invention is incorporated. In addition, a BiCMOS semiconductor device including a bipolar transistor in addition to the NMOS and the PMOS can also be given as the semiconductor device in which the insulated gate field effect transistor according to any of the embodiments of the present invention is incorporated.

According to an embodiment of the present invention, at a time point when formation of the gate electrode is completed in the so-called damascene process, the top surface of the gate electrode shows the state in which none of the gate insulating film, and the upper end surface of the first layer (work function controlling layer) for regulating the work function of the gate electrode is exposed thereto. Therefore, when forming the contact plugs above the gate electrode and the source/drain region, the opening portions for contact plug formation are provided by dry-etching the interlayer insulating layer and the insulating layer, and the pretreatment for the contact plug formation is carried out, or the lower insulating layer is removed, it is possible to reliably prevent occurrence of such a phenomenon that the gate insulating film, the first layer, or the gate insulating film and the first layer are etched. As a result, it is possible to provide the insulated gate field effect transistor having the high reliability. In addition, for example, the work function of the gate electrode in the n-channel insulated gate field effect transistor can be reliably held at a desired value. Also, the gate electrode having the high reliability can be formed without depending on wideness and narrowness in width of the gate electrode.

In addition, as the case may be, the material of which the top surface of the gate electrode of the n-channel insulated gate field effect transistor is made, and the material of which the top surface of the gate electrode of the p-channel insulated gate field effect transistor is made can be made identical to each other. As a result, the opening portion for contact plug formation can be reliably formed in the interlayer insulating layer under the stable etching conditions.

DETAILED DESCRIPTION OF THE PREFERRED EMBODIMENTS

Preferred embodiments of the present invention will be described in detail hereinafter with reference to the accompanying drawings.

Embodiment 1

Embodiment 1 relates to an insulated gate field effect transistor and a method of manufacturing the same.

Figure 1A:
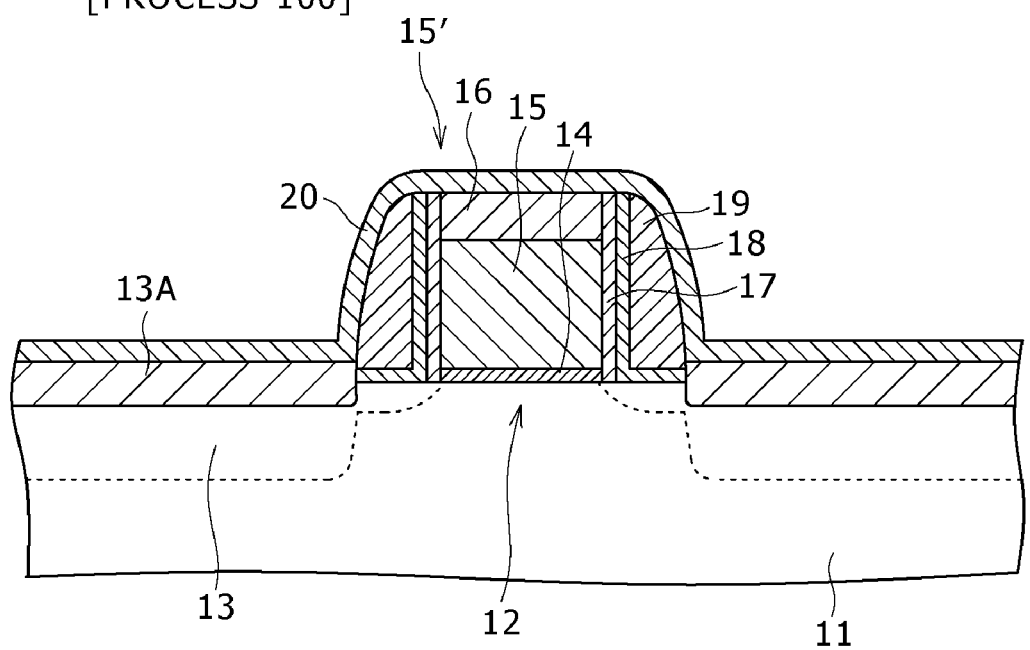
FIGS. 1A to 1O are respectively schematically partial end views, of a semiconductor substrate and the like, explaining a method of manufacturing an insulated gate field effect transistor according to Embodiment 1 of the present invention.
Figure 1B:
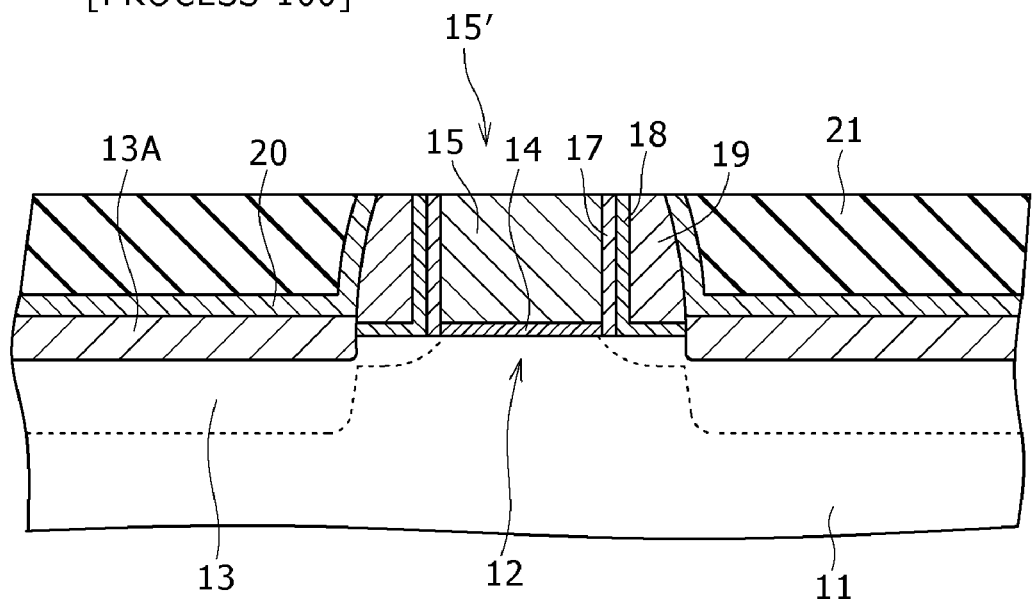
FIG. 1P is a schematically partially enlarged cross sectional view of a gate electrode and the like of the insulated gate field effect transistor according to Embodiment 1 of the present invention.
Figure 1C:
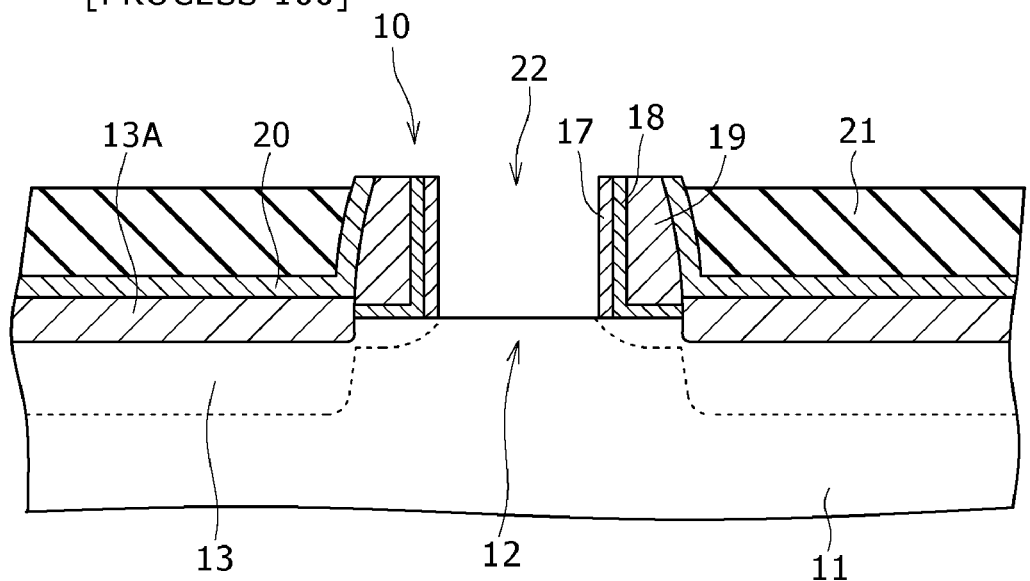
Figure 1D:
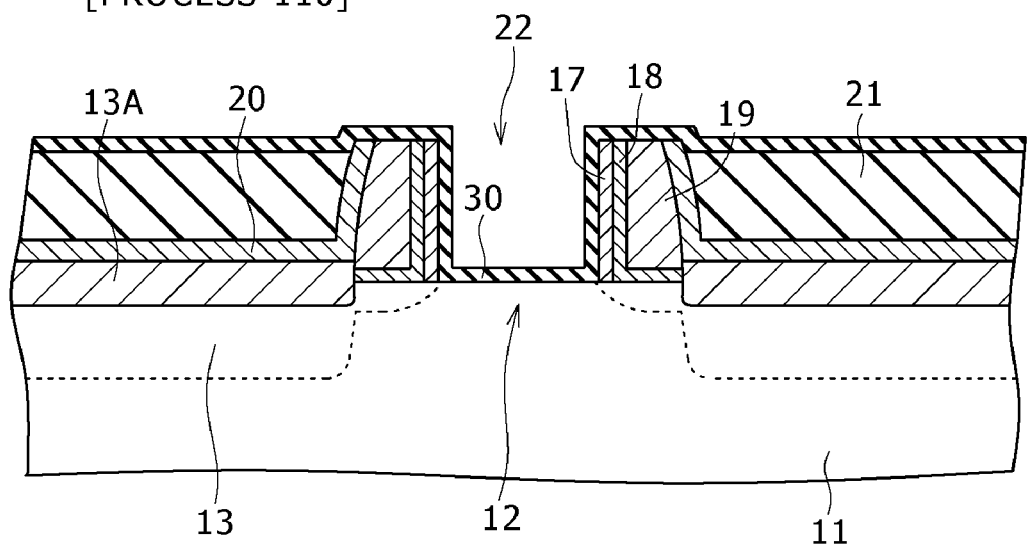
Figure 1E:
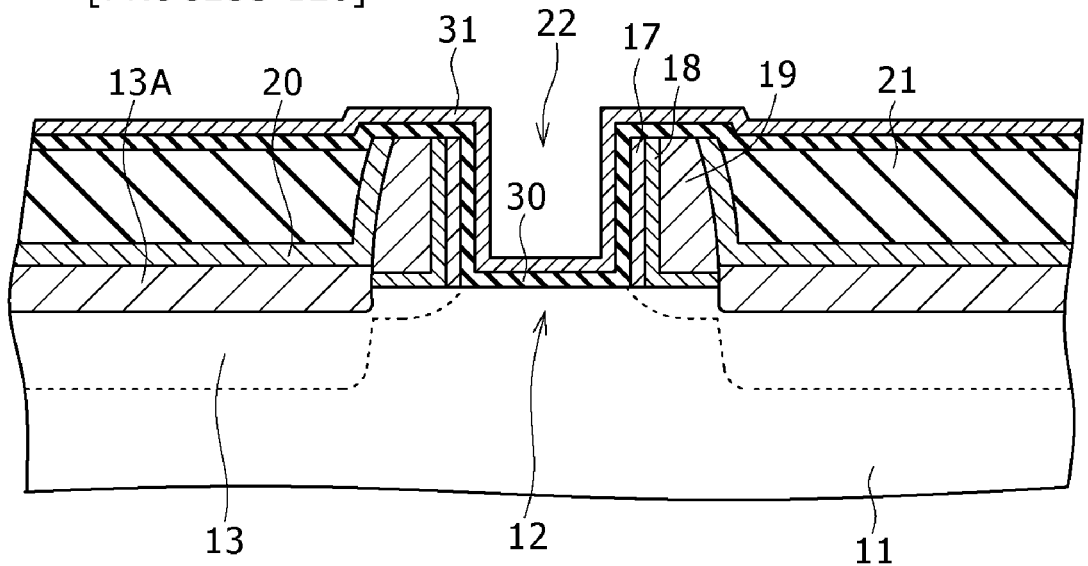
Figure 1F:
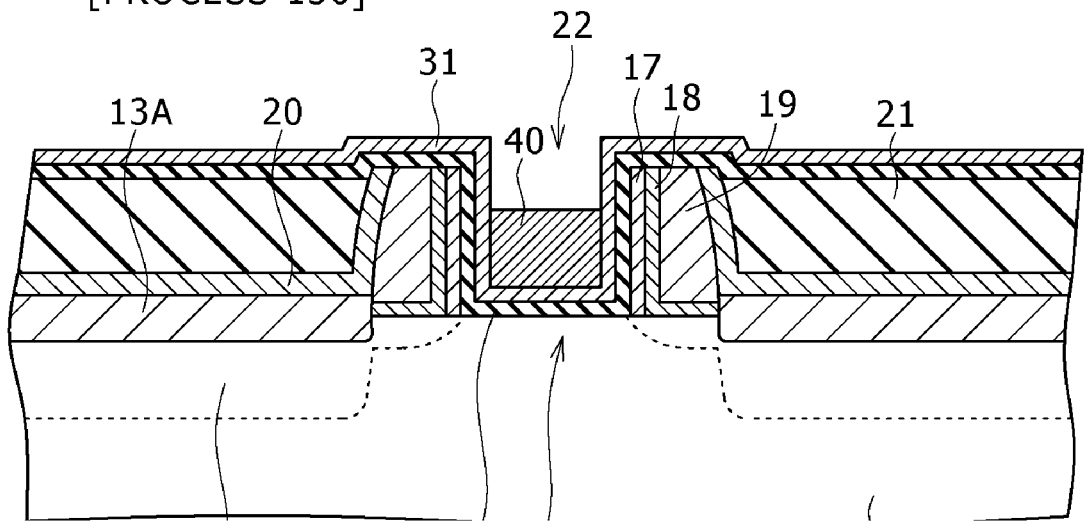
Figure 1G:
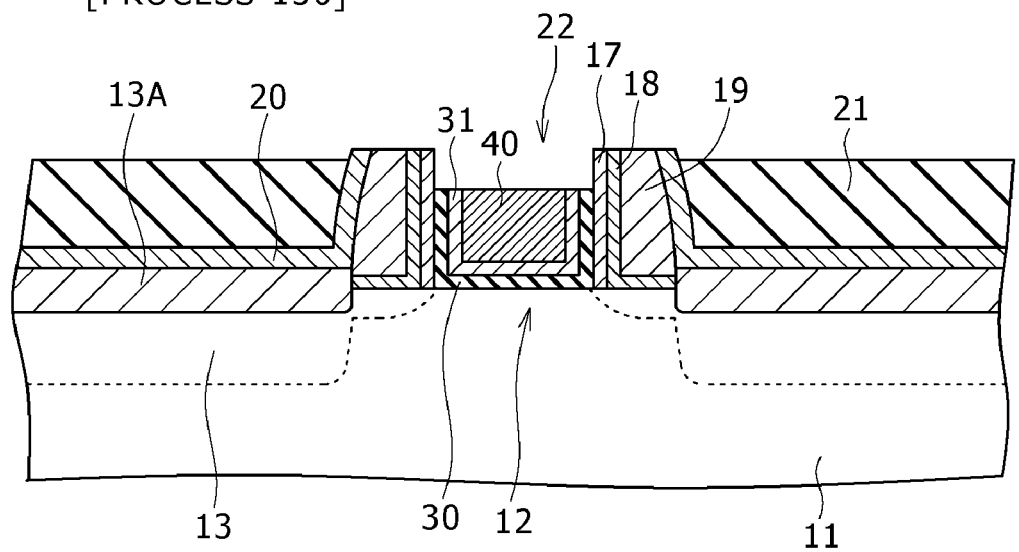
Figure 1H:
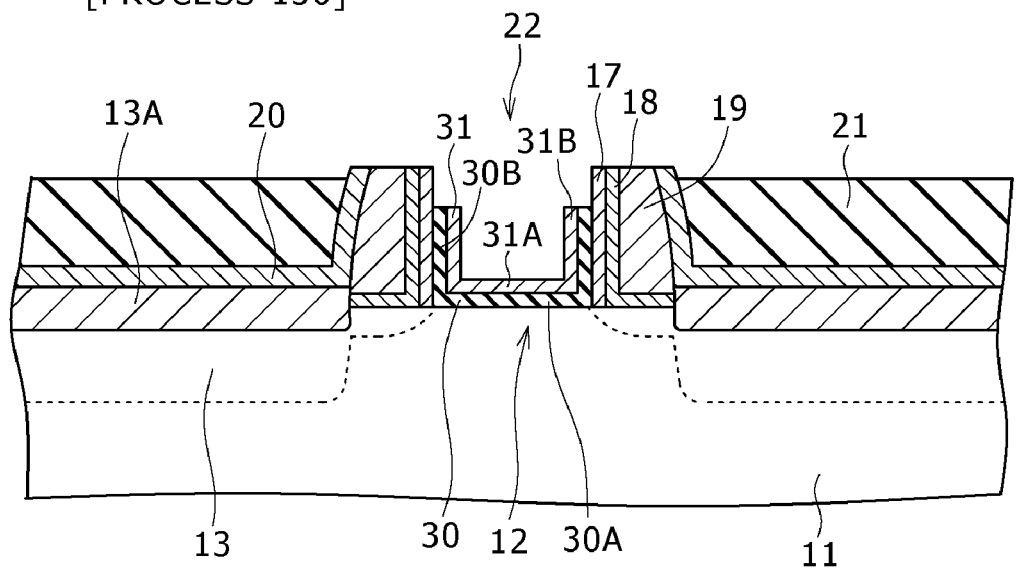
Figure 1I:
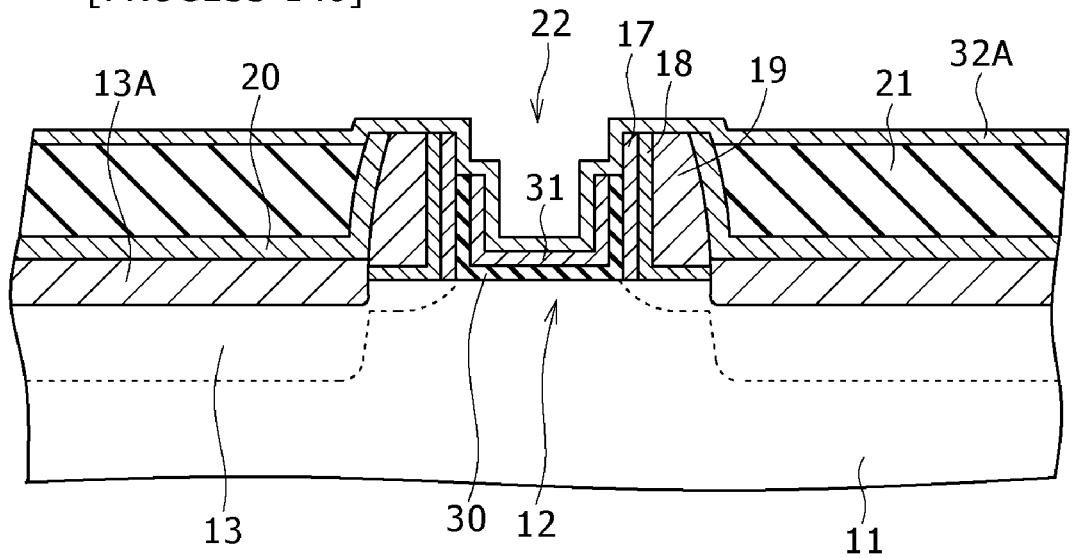
Figure 1J:
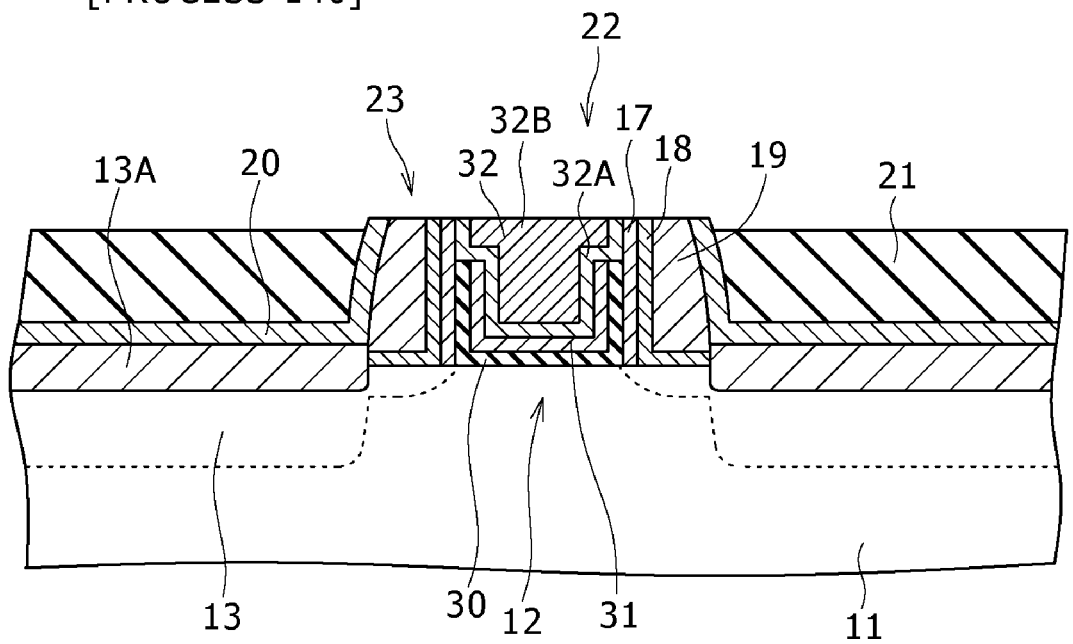
Figure 1K:
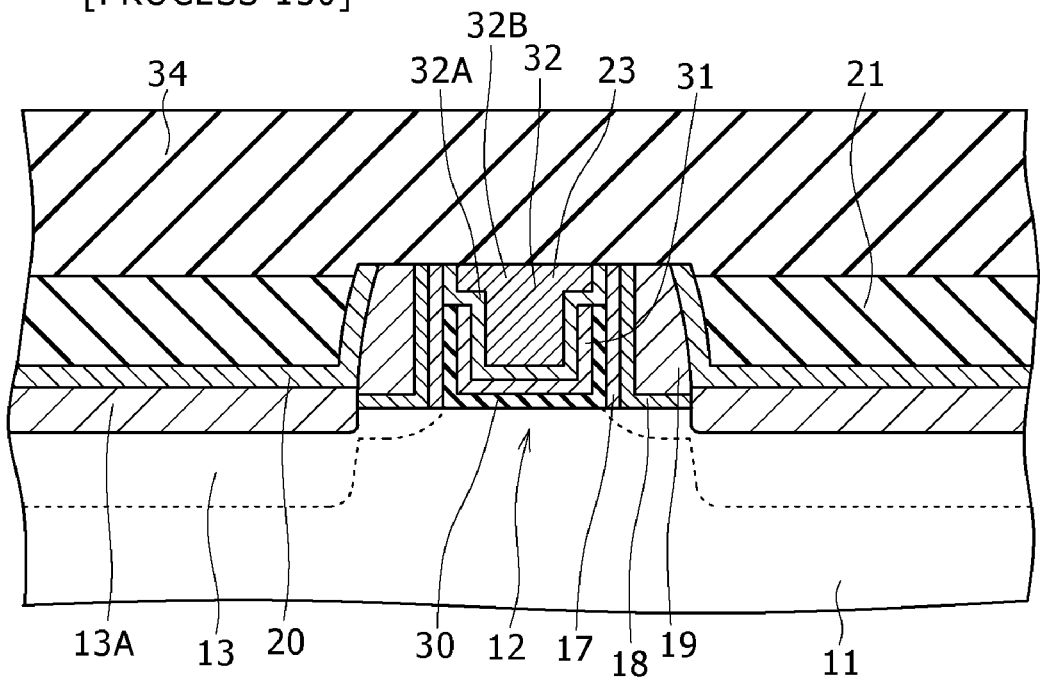
Figure 1L:
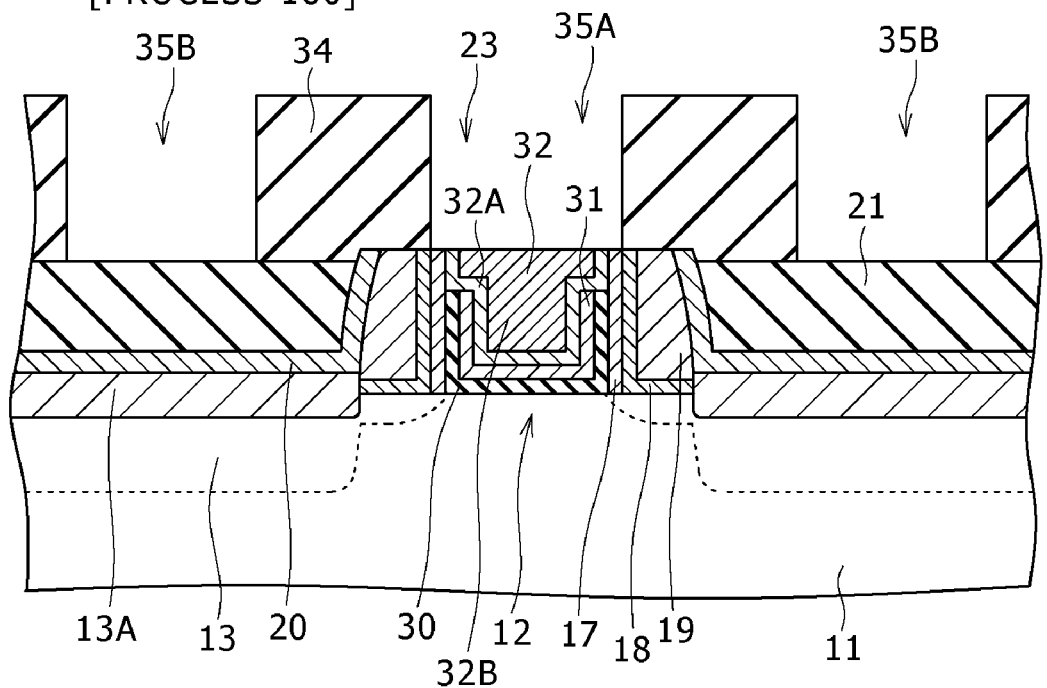
Figure 1M:
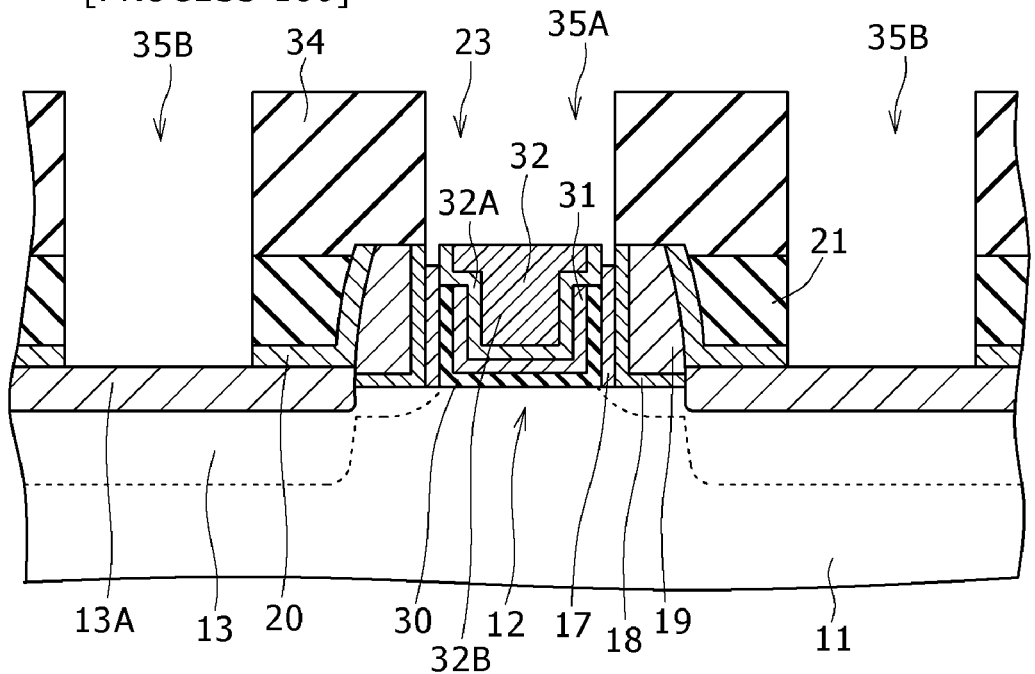
Figure 1N:
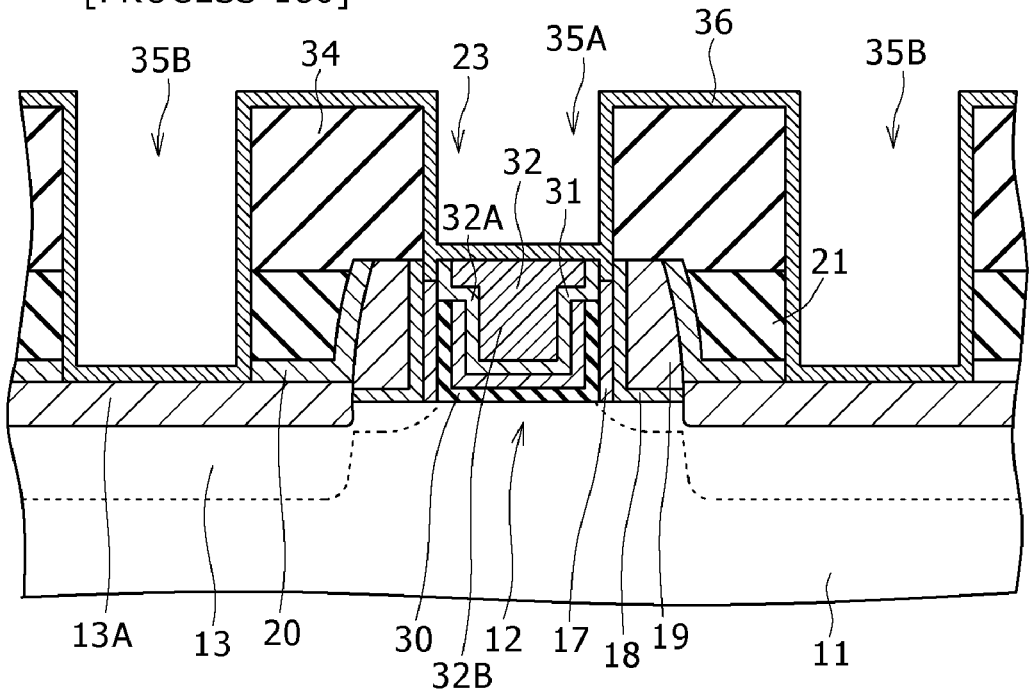
Figure 1O:
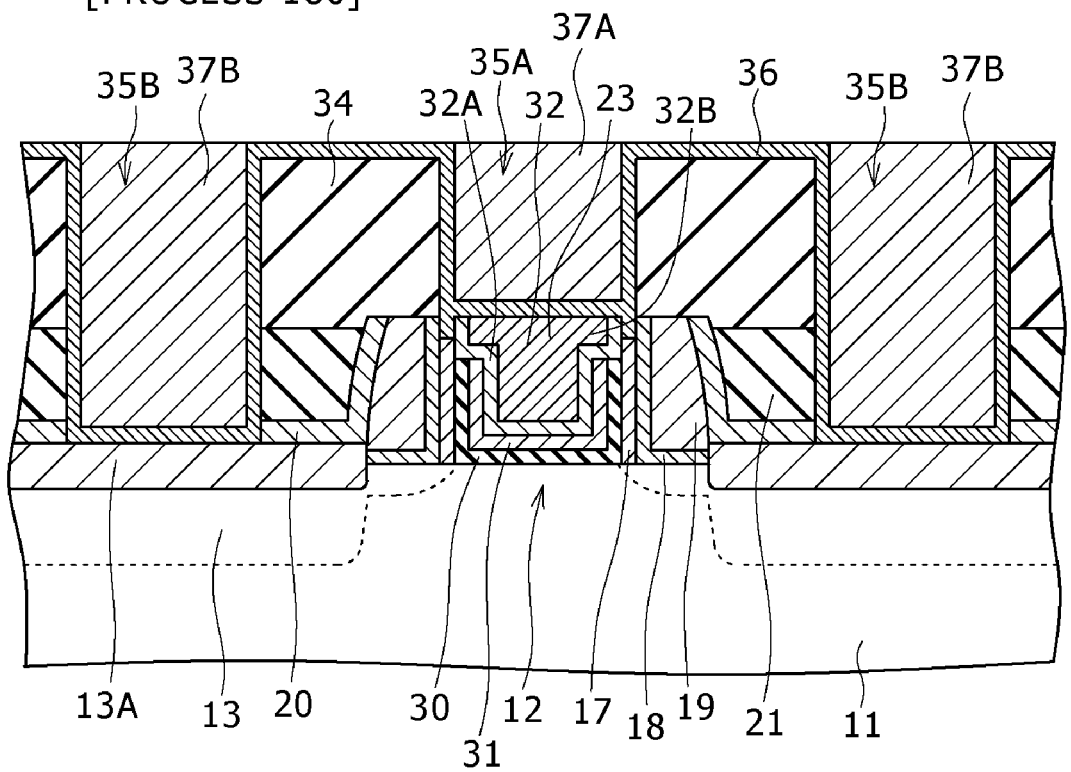

As shown in the form of a schematically partial end view in FIG. 1O, the insulated gate field effect transistor of Embodiment 1 is one including:

(A) a source/drain region 13 and a channel formation region 12;

(B) a gate electrode 23 formed above the channel formation region 12; and (C) a gate insulating film 30.

It is to be noted that in Embodiment 1, the insulated gate field effect transistor is set as n-channel one.

Figure 1P:
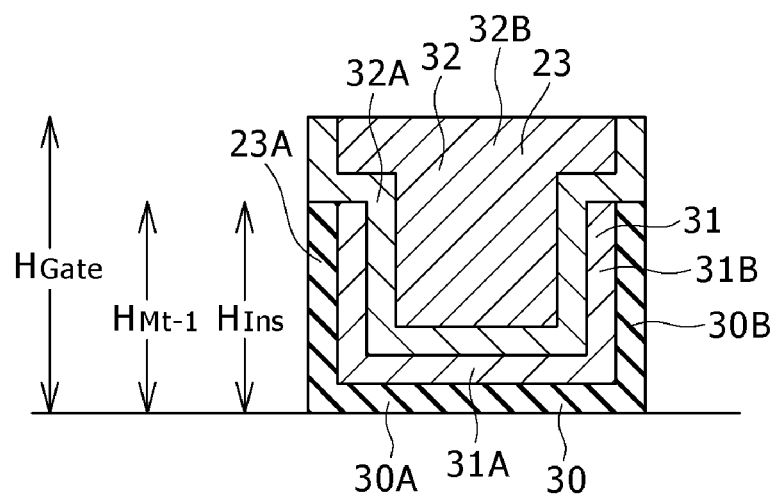

As shown in the form of a schematically enlarged cross sectional view in FIG. 1P, the gate insulating film 30 made of a hafnium oxide is composed of a gate insulating film main body portion 30A formed between the gate electrode 23 and the channel formation region 12, and a gate insulating film extension portion 30B extending from the gate insulating film main body portion 30A to a middle of a side surface portion 23A of the gate electrode 23. Also, as shown in FIG. 1P, when a height of the gate electrode 23 is $H_{Gate}$ and a height of the gate insulating film extension portion 30B is $H_{Ins}$ with a surface of the channel formation region 12 as a reference, a relationship of $H_{Ins} < H_{Gate}$ is fulfilled.

In the insulated gate field effect transistor of Embodiment 1, the gate electrode 23 is composed of a first layer (work function controlling layer) 31 made of a first metallic material (specifically, a metallic material for regulating a work function of the gate electrode 23, and more specifically, hafnium silicide [$HfSi_x$]), and a second layer 32 made of a second metallic material different from the first metallic material. Also, the first layer 31 is formed in the form of a thin film so as to extend from a bottom surface portion of the gate electrode 23 facing the channel formation region 12 to a middle of a side surface portion 23A of the gate electrode 23. The second layer 32 occupies a remaining portion of the gate electrode 23. In addition, when a height of a portion 31B of the first layer 31 formed so as to extend to the middle of the side surface portion 23A of the gate electrode 23 is $H_{Mt-1}$ with the surface of the channel formation region 12 as the reference, a relationship of $H_{Mt-1} < H_{Gate}$ is fulfilled. Also, a relationship of $H_{Ins} \approx H_{Mt-1}$ is established. Note that, a portion of the first layer 31 formed on the bottom surface portion of the gate electrode 23 is designated with reference symbol 31A, and a portion of the first layer 31 formed so as to extend to the middle of the side surface portion 23A of the gate electrode 23 is designated with reference symbol 31B. More specifically, values of $H_{Gate}$, $H_{Ins}$ and $H_{Mt-1}$ are set as follows:

$H_{Gate} \approx 100$ nm
$H_{Ins} \approx 50$ nm
$H_{Mt-1} \approx 50$ nm

This setting also applies to Embodiment 2 and Embodiment 3 which will be described later. It is to be noted that in Embodiment 1, the second layer 32 is composed of two layers having a thin film outer layer 32A, and an inner layer 32B. The outer layer 32A of the second layer 32 is formed so as to extend from an upper surface of the first layer 31 to the side surface portion of the gate electrode 23, and the inner layer 32B of the second layer 32 occupies the remaining portion of the gate electrode 23. Also, the outer layer 32A is made of titanium nitride (TiN), and the inner layer 32B is made of tungsten (W). Here, the outer layer 32A functions as a barrier layer and an adhesion enhancing layer, and thus has a function as a metallic material layer (work function controlling layer) for regulating the work function of the gate electrode in a PMOS. Moreover, formation of the outer layer 32A is not essential to the insulated gate field effect transistor of Embodiment 1, and thus the second layer 32 can also be structured in the form of one layer.

In the insulated gate field effect transistor of Embodiment 1, the side surface portion 23A of the gate electrode 23 contacts a sidewall. Here, the sidewall is composed of an offset spacer 17 which is provided adjacent to the side surface portion of the gate electrode 23, and a first sidewall 18 and a second sidewall 19 which are located outside the offset spacer 17. In addition, a silicide layer (specifically, a nickel platinum silicide layer) 13A is formed on the surface of the source/drain region 13. Moreover, a stress liner layer 20 made of SiN is formed above the source/drain region 13, and a lower insulating layer 21 is formed on the stress liner layer 20. An insulating layer is composed of the lower insulating layer 21, the stress liner layer 20, and the sidewall.

In addition, an insulator insulating layer 34 is formed on the lower insulating layer 21 and the like. An opening portion 35A for contact plug formation is provided in a portion, of the interlayer insulating layer 34, which is located above the channel formation region 12. A contact plug 37A which is made of tungsten and which is connected to a top surface of the gate electrode 23 is provided within the opening portion 35A for contact plug formation. Also, at least one of the inner layer 32B and the outer layer 32A exists between a bottom surface of the contact plug 37A and an upper end portion of the gate insulating film extension portion 30B. Note that, when the second layer 32 is structured in the form of one layer, the second layer 32 exists between the bottom surface of the contact plug 37A and the upper end portion of the gate insulating film extension portion 30B. On the other hand, an opening portion 35B for contact plug formation is provided in a portion, of the interlayer insulating layer 34, which is located above the source/drain region 13. A contact plug 37B which is made of tungsten and which is connected to the silicide layer 13A constituting the source/drain region 13 is provided within the opening portion 35A for contact plug formation. Note that, reference numeral 11 designates a silicon semiconductor substrate, and reference numeral 36 designates a second barrier layer for formation of the contact plugs 37A and 37B.

Hereinafter, a method of manufacturing the insulated gate field effect transistor of Embodiment 1 will be described in detail with reference to FIGS. 1A to 1P as schematically partial end views of the silicon semiconductor substrate and the like.

[Process-100]

Firstly, there is prepared a base 10 including the channel formation region 12 and the source/drain region 13, the lower insulating layer 21 made of $SiO_2$, and an opening portion 22 for gate electrode formation which is formed above the channel formation region 12.

Specifically, after an isolation region (not shown) is formed in the silicon semiconductor substrate 11, a dummy insulating film 14 is formed on a surface of the silicon semiconductor substrate 11. Next, after a dummy polysilicon layer 15, and a hard mask layer made of SiN are formed in order, a dummy gate electrode 15' is formed by utilizing the photolithography technique and the dry etching technique. The dummy gate electrode 15' has a laminated structure having the dummy polysilicon layer 15 and the hard mask 16. Next, after impurity ions are shallowly implanted into the silicon semiconductor substrate 11 for the purpose of forming an LDD structure, an offset spacer 17 made of SiN is formed on a side surface of the dummy gate electrode 15'. Next, an $SiO_2$ layer for formation of a first sidewall 18, and an SiN layer for formation of a second sidewall 19 are formed in order. The first sidewall 18 and the second sidewall 19 which are located outside the offset spacer 17 can be obtained by performing etch back for the SiN layer and the $SiO_2$ layer, respectively. After that time, impurity ions are deeply implanted into the silicon semiconductor substrate 11, thereby forming the source/drain region 13. Next, a nickel-platinum layer is formed over the entire surface of the base 10, and a heating treatment is then carried out, thereby silicidizing an upper portion of the source/drain region 13. As a result, the silicide layer 13A can be obtained. After that, the unreacted nickel-platinum layer is removed, and the heating treatment is carried out again, thereby stabilizing the silicide layer 13A. By carrying out the above process, it is possible to obtain the source/drain region 13 including an extension region and the silicide layer 13A (low resistance layer). Here, a region sandwiched between the extension regions of the adjacent source/drain regions 13 becomes the channel formation region 12. After that time, the stress liner layer 20 made of SiN is formed over the entire surface of the base 10. As a result, a state shown in FIG. 1A can be obtained.

After that, after the lower insulating layer 21 made of $SiO_2$ is formed over the entire surface of the base 10, the flattening treatment is carried out by utilizing the CMP method, thereby removing a part of the lower insulating layer 21 and the hard mask 16 (as the case may be, further removing a part of the dummy polysilicon layer 15 and a part of the sidewall). As a result, a state shown in FIG. 1B can be obtained.

Next, the exposed dummy gate electrode 15' is removed by utilizing an etching method using radicals of fluorine or the like. Moreover, the dummy insulating film 14 is removed by, for example, utilizing a wet etching method using a dilute hydrofluoric acid. As a result, a state shown in FIG. 1C can be obtained.

[Process-110]

Next, the gate insulating film 30 is formed both on the surface of the channel formation region 12 exposed to a bottom portion of the opening portion 22 for gate electrode formation, and on the sidewall of the opening portion 22 for gate electrode formation. Now, in Embodiment 1, the gate electrode 23 is composed of the first layer (work function controlling layer) 31 made of the first metallic material, and the second layer 32 made of the second metallic material different from the first metallic material. Therefore, in Embodiment 1, the gate insulating film 30, and the first layer 31 made of the first metallic material are formed in order both on the surface of the channel formation region 12 exposed to the bottom portion of the opening portion 22 for gate electrode formation, and on the sidewall of the opening portion 22 for gate electrode formation.

Specifically, the gate insulating film 30, having a thickness of 3.0 nm, made of a hafnium oxide is formed over the entire surface of the base 10 (refer to FIG. 1D). The gate insulating film 30 can be formed by utilizing the CVD method, for example, using $HfCl_2$ and $NH_3$ as a source gas, or can also be formed by utilizing the CVD method using an organic system Hf gas as a source gas. Or, the gate insulating film 30 can be formed by oxidizing a hafnium nitride film after the hafnium nitride film is formed by utilizing the sputtering method using the hafnium nitride as a target, or can also be formed by utilizing the ALD method.

[Process-120]

Next, in Embodiment 1, the first layer 31, having a thickness of 15 nm, made of hafnium silicide ($HfSi_x$) is formed on the entire surface of the base 10 (specifically, on the gate insulating film 30) by utilizing the sputtering method (refer to FIG. 1E).

[Process-130]

After that, the gate insulating film 30 formed on the sidewall of the opening portion 22 for gate electrode formation is selectively removed. As a result, the gate insulating film 30 composed of the gate insulating film main body portion 30A, and the gate insulating film extension portion 30B. Here, the gate insulating film main body portion 30A is left on the bottom portion of the opening portion 22 for gate electrode formation. Also, the gate insulating film extension portion 30B extends from the gate insulating film main body portion 30A to the middle of the sidewall of the opening portion 22 for gate electrode formation. Specifically, the gate insulating film 30 formed on the sidewall of the opening portion 22 for gate electrode formation is selectively removed in the following process. In the process concerned, after a resist layer 40 is formed over the entire surface of the base 10, the etch back is performed for the resist layer 40 to leave the resist layer 40 in the lower portion of the opening portion 22 for gate electrode formation. Next, after a portion, of the gate insulating film 30, exposed to an upper portion of the sidewall of the opening portion 22 for gate electrode formation is removed, the resist layer 40 is removed away.

Now, as has been described above, the gate electrode 23 is composed of the first layer 31 and the second layer 32. Therefore, the gate insulating film 30 and the first layer 31 which are formed on the sidewall of the opening portion 22 for gate electrode formation are selectively removed, thereby obtaining the gate insulating film 30, and the first layer 31. In this case, as described above, the gate insulating film 30 is composed of the gate insulating film main body portion 30A left on the bottom portion of the opening portion 22 for gate electrode formation, and the gate insulating film extension portion 30B extending from the gate insulating film main body portion 30A to the middle of the sidewall of the opening portion 22 for gate electrode formation. Also, the first layer 31 is formed so as to extend from the bottom surface portion, of the gate electrode 23, facing the channel formation region 12 to the middle of the side surface portion 23A of the gate electrode 23. Here, referring now to FIG. 1H, the portion, of the first layer 31, formed on the bottom surface portion of the gate electrode 23 is designated with reference symbol 31A, and the portion, of the first layer 31, formed so as to extend to the middle of the side surface portion 23A of the gate electrode 23 is designated with reference symbol 31B.

More specifically, after the resist layer 40 is formed over the entire surface of the base 10, the etch back is performed for the resist layer 40, thereby leaving the resist layer 40 in the lower portion of the opening portion 22 for gate electrode formation (refer to FIG. 1F). The etch back for the resist layer 40, for example, may be performed under the following conditions:

[The Etch Back for the Resist Layer 40]
used gas: $O_2/S_2Cl_2/N_2$=30 sccm/10 sccm/10 sccm Next, after the portion of the first layer 31 and the portion of the gate insulating film 30 which are exposed to the upper portion of the sidewall of the opening portion 22 for gate electrode formation are removed by utilizing the dry etching method under the following conditions (refer to FIG. 1G), the resist layer 40 is removed away by the utilizing an ashing method (refer to FIG. 1H).

[The Dry Etching for the Portion of The First Layer 31 and the Portion of the Gate Insulating Film 30]
used gas: $Cl_2/BCl_3$=35 sccm/10 sccm
source power: 1,000 W
bias power: 150 W
pressure: 1.3 Pa (10 mTorr)
substrate temperature: 40° C.

[Process-140]

Next, the metallic material is filled in the opening portion 22 for gate electrode formation, thereby obtaining the gate electrode 23. Specifically, the second metallic material is filled in a remaining portion of the opening portion 22 for gate electrode formation, thereby obtaining the gate electrode 23 composed of the first layer 31 and the second layer 32.

More specifically, firstly, the thin film outer layer 32A, made of TiN, which functions as the barrier layer is formed over the entire surface of the base 10 by utilizing the sputtering method (refer to FIG. 1I). The thin film outer layer 32A having a thickness of 10 nm can be formed by utilizing any one of the CVD method, the sputtering method, and the ALD method (alternately using an $NH_3$ gas and a $TiCl_4$ gas). It is to be noted that when the first layer made of hafnium silicide ($HfSi_x$) in a region in which a PMOS is to be formed is removed away before formation of the outer layer 32A, and the outer layer 32A made of TiN is directly formed on the region in which the PMOS is to be formed, the outer layer 32A functions as the work function controlling layer, that is, the first layer 31.

After that time, after the inner layer 32B, having a thickness of 0.2 μm, made of tungsten is formed over the entire surface of the base 10 by utilizing the so-called blanket tungsten CVD method, the flattening treatment is carried out for the inner layer 32B by utilizing the CMP method. As a result, portions, of the inner layer 32B and the outer layer 32A, extending over the lower insulating layer 21, the offset spacer 17, the first sidewall 18 and the second sidewall 19 are removed (refer to FIG. 1J). In such a manner, it is possible to obtain the gate electrode 23 constituted by the second layer 32 composed of the two layers having the outer layer 32A and the inner layer 32B. Here, the gate electrode 23 is formed above the channel formation region 12 through the gate insulating film 30, and is composed of the first layer 31, and the second layer 32 (composed of the outer layer 32A and the inner layer 32B). Since the top surface of the gate electrode 23 is merely constituted by the second layer 32 (composed of the outer layer 32A and the inner layer 32B), none of the first layer 31 and the gate insulating film 30 is exposed to the outside. It is to be noted that a distance from the top surface of the gate electrode 23 to the upper end portion of the gate insulating film extension portion 30B formed so as to extend to the middle of the sidewall of the opening portion 22 for gate electrode formation is preferably equal to or larger than 5 nm. Therefore, when the gate insulating film 30 composed of the gate insulating film main body portion 30A, and the gate insulating film extension portion 30B extending from the gate insulating film main body portion 30A to the middle of the sidewall of the opening portion 22 for gate electrode formation is obtained in [Process-130], the gate insulating film 30 is etched so that the distance from the top surface of the gate electrode 23 to the upper end portion of the gate insulating film extension portion 30B formed so as to extend to the middle of the sidewall of the opening portion 22 for gate electrode formation becomes equal to or larger than 5 nm.

[Process-150]

Next, the interlayer insulating layer 34 made of $SiO_2$ is formed over the entire surface of the base 10 by utilizing the CVD method such as the plasma CVD method, the high density plasma CVD method, or the atmospheric pressure CVD method (refer to FIG. 1K).

[Process-160]

After that time, the opening portions 35A and 35B for contact plug formation are formed in portions, of the interlayer insulating layer 34, which are located above the gate electrode 23, and the source/drain region 13, respectively, by utilizing the photolithography technique and the dry etching technique. Note that, FIG. 1L shows a state at a time point when formation of the opening portion 35A for contact plug formation is completed, and the opening portion 35B for contact plug formation is in the middle of formation. Also, FIG. 1M shows a state at a time point when formation of the opening portion 35B for contact plug formation is completed. Here, although a resist layer for the etching is actually formed, an illustration of such a resist layer is omitted here for the sake of simplicity.

[Process-170]

Next, a pretreatment for removing a natural oxide film and the like is carried out for the purpose of forming the contact plugs 37A and 37B. With regard to the pretreatment, for example, a chemical solution treatment using a dilute hydrofluoric acid, a sputtering treatment using an argon gas, or an etching treatment using radicals of fluorine can be given.

[Process-180]

After that time, the second barrier layer 36 constituted by the laminated structure having a lower layer made of Ti and an upper layer made of TiN is formed over the entire surface of the base 10 by utilizing the sputtering method. Also, the tungsten layer is formed over the entire surface of the base 10 by utilizing the so-called blanket tungsten CVD method (deposition temperature: 350° C.) using a $WF_6$ gas, an $H_2$ gas, and an $SiH_4$ gas. Thereafter, the flattening treatment is carried out by utilizing the CMP method, thereby making it possible to obtain the contact plugs 37A and 37B in the opening portions 35A and 35B for contact plug formation, respectively (refer to FIGS. 1O and 1P). After that time, wirings (not shown) and the like are formed on the interlayer insulating layer 34 as may be necessary, thereby making it possible to complete the insulated gate field effect transistor of Embodiment 1.

In Embodiment 1, at the time point when the gate electrode is completed in the so-called damascene process, that is, in [-140] (refer to FIG. 1J), none of the upper end surfaces of the gate insulating film 30 and the first layer 31 is exposed to the outside. Therefore, in [Process-160], for the purpose of forming the opening portions 35A and 35B for contact plug formation, the interlayer insulating layer 34 made of $SiO_2$ is dry-etched (refer to FIG. 1L), and subsequently both the lower insulating layer 21 made of $SiO_2$, and the stress liner layer 20 made of SiN are dry-etched (refer to FIG. 1M). However, none of the upper end surfaces of the gate insulating film 30 and the first layer 31 is exposed to the outside. Therefore, it is possible to prevent occurrence of such a phenomenon that both the gate insulating film 30 and the first layer 31 are etched. Moreover, it is possible to prevent the first layer 31 from being etched by the pretreatment in [Process-170]. For this reason, it is possible to prevent the reliability of the resulting gate electrode 23 from being reduced. In addition, when the contact plug 37A is formed in [Process-180], a void can be prevented from occurring in the contact plug 37A. Moreover, although the material of the portion, located above the gate electrode 23, which is to be etched in order to form the opening portion 35A for contact plug formation, and the material of the portion, located above the source/drain region 13, which is to be etched in order to form the opening portion 35B for contact plug formation are different from each other, it is easy to optimize the conditions for formation of the opening portions 35A and 35B for contact plug formation because none of the upper end surfaces of the gate insulating film 30 and the first layer 31 is exposed to the outside.

Embodiment 2

Embodiment 2 is a change of Embodiment 1. Specifically, Embodiment 2 relates to a method of manufacturing an insulated gate field effect transistor.

Figure 2A:
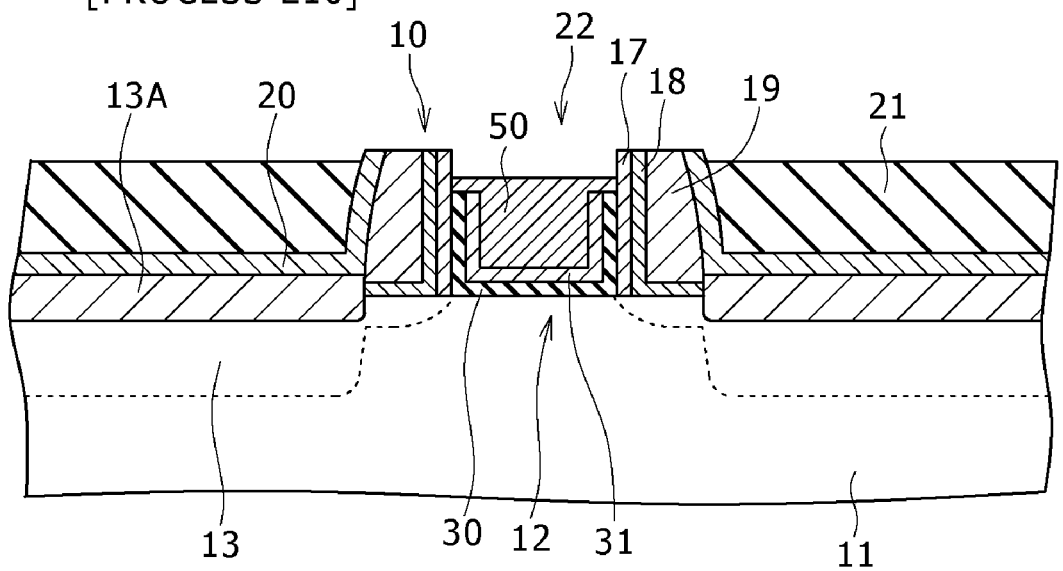
FIGS. 2A to 2C are respectively schematically partial end views, of a semiconductor substrate and the like, explaining a method of manufacturing an insulated gate field effect transistor according to Embodiment 2 of the present invention.
Figure 2B:
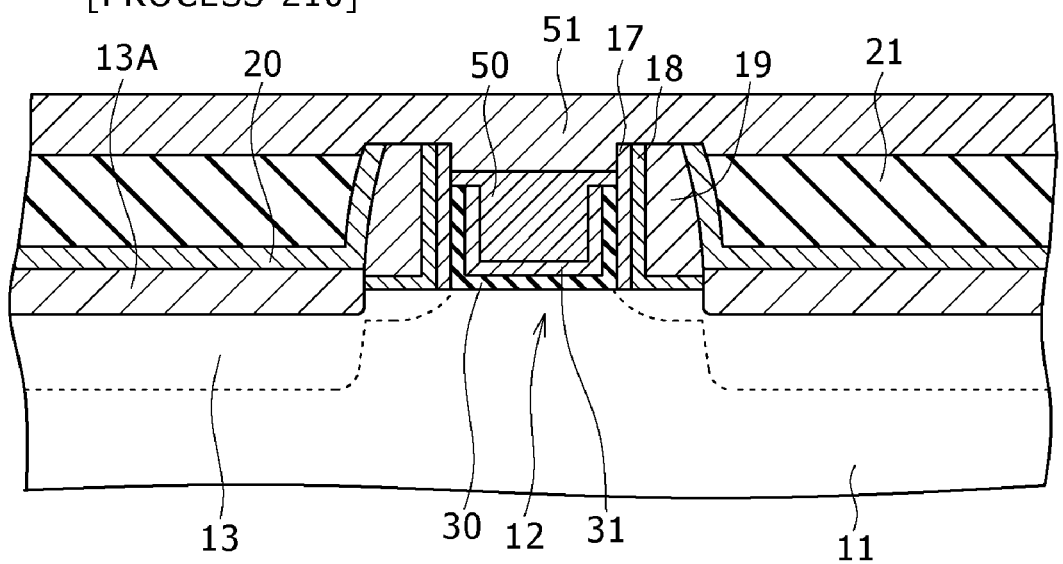
Figure 2C:
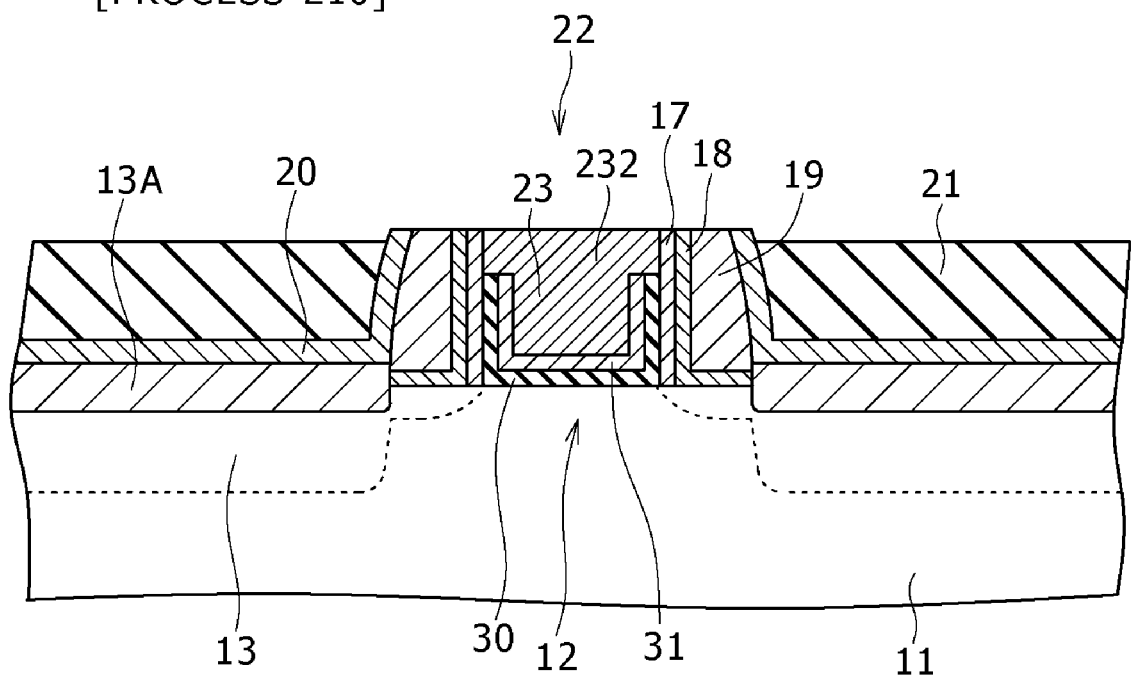
Figure 3A:
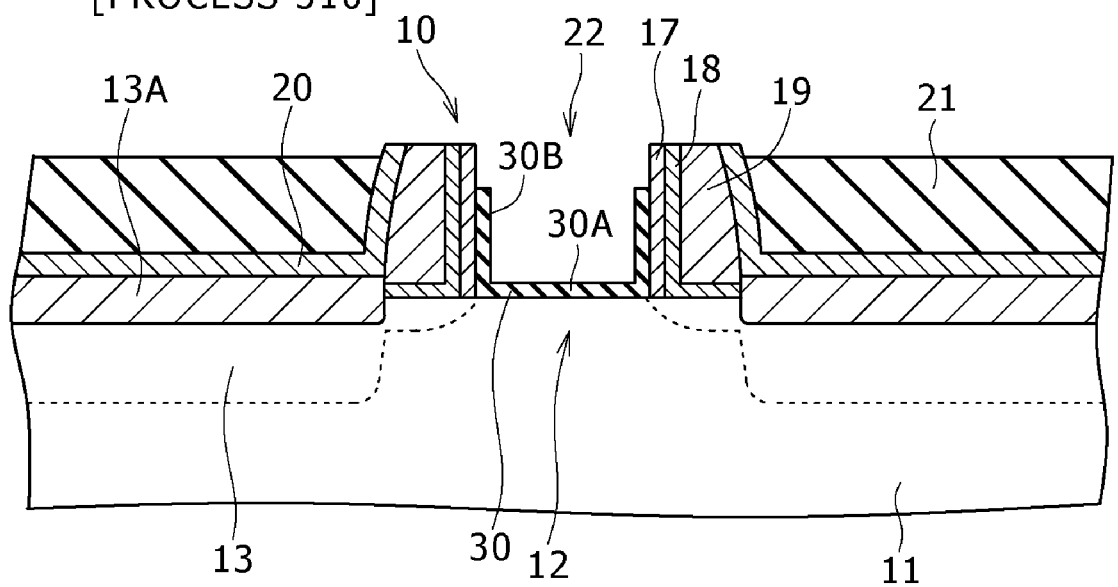
FIGS. 3A to 3D are respectively schematically partial end views, of a semiconductor substrate and the like, explaining a method of manufacturing an insulated gate field effect transistor according to Embodiment 3 of the present invention.
Figure 3B:
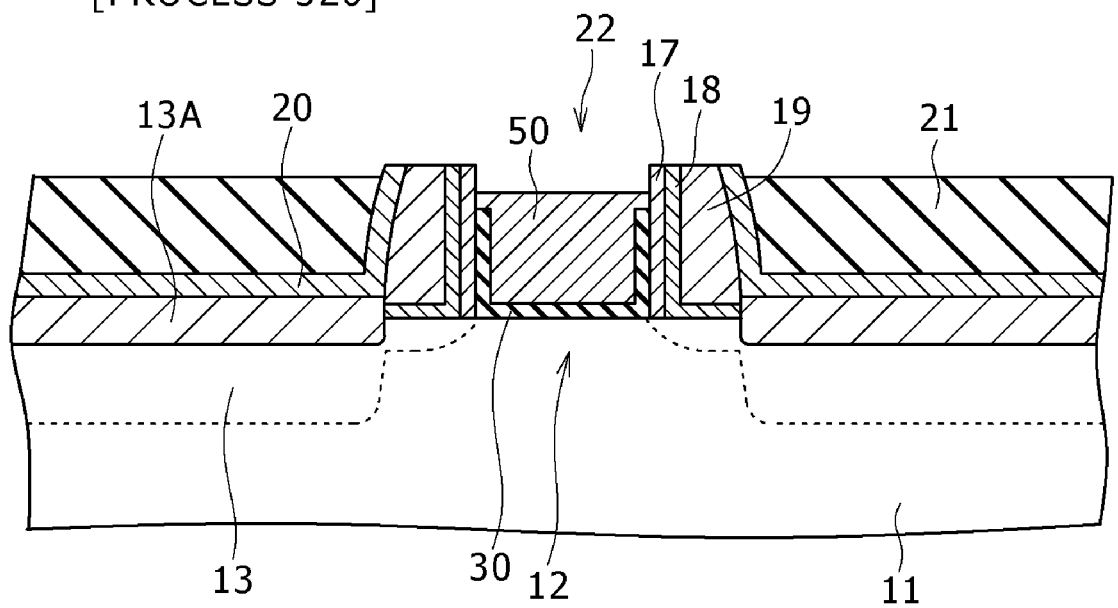
Figure 3C:
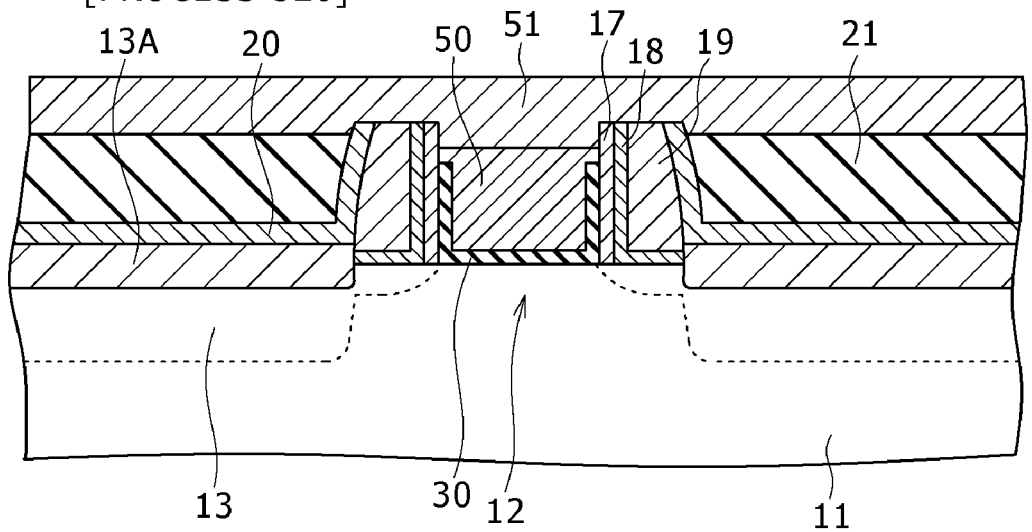
Figure 3D:
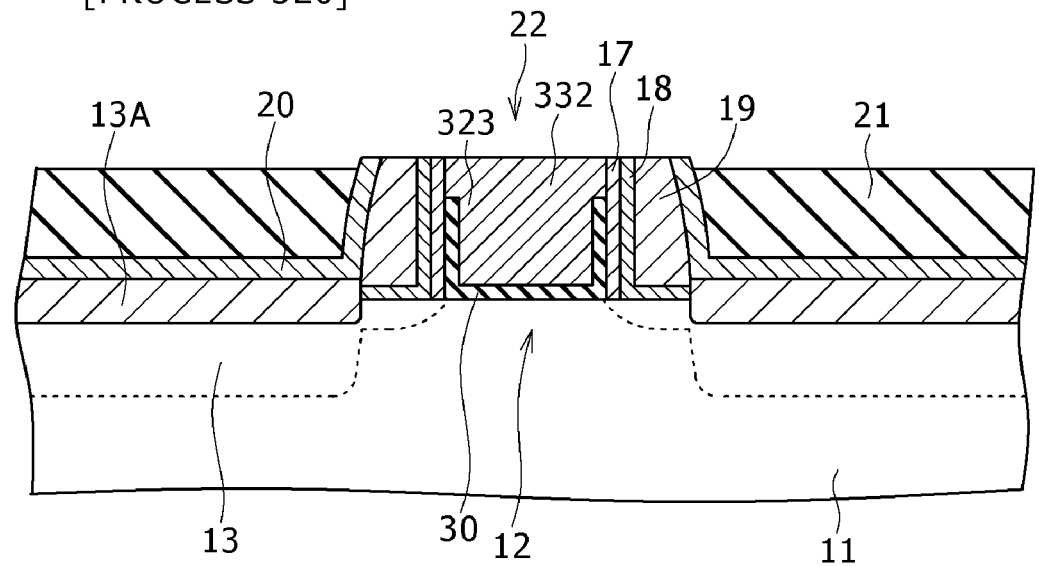

Although Embodiment 2 is identical to Embodiment 1 in that the first layer 31 is made of hafnium silicide ($HfSi_x$), Embodiment 2 is different from Embodiment 1 in that a second layer 232 is made of nickel silicide. In addition, Embodiment 2 is different from Embodiment 1 in a method of forming the second layer 232. Hereinafter, a method of manufacturing an insulated gate field effect transistor of Embodiment 2 will be described in detail with reference to FIGS. 2A to 2C.

[Process-200]

Firstly, the same processes as those of [Process-100] to [-130] of Embodiment 1 are carried out.

[Process-210]

After that time, a metallic material is filled in the remaining portion of the opening portion 22 for gate electrode formation by utilizing the following method. That is to say, a conductive material layer 50 is formed on a lower portion of the opening portion 22 for gate electrode formation. Specifically, after the conductive material layer 50 made of amorphous silicon is formed over the entire surface of the base 10 by utilizing the CVD method, the conductive material layer 50 is etched in a thickness direction by utilizing the etch back method to leave the conductive material layer 50 on the opening portion 22 for gate electrode formation (refer to FIG. 2A). Next, a metallic material layer 51, having a thickness of 20 nm, made of nickel is formed over the entire surface of the base 10 by utilizing either the PVD method such as the sputtering method, or the CVD method (refer to FIG. 2B). Thereafter, a heating treatment is carried out at 580° C. for 60 seconds at an ambient pressure to cause the conductive material layer 50 and the metallic material layer 51 to chemically react with each other, thereby forming a nickel silicide layer. Next, the unreacted metallic material layer 51 is dipped into a mixed liquid obtained by mixing HCl, $H_2O_2$ and $H_2O$ with one another at a mixing ratio of 1:1:2 for 15 minutes to be removed. Subsequently, the heating treatment is carried out again, thereby stabilizing the nickel silicide layer. In such a manner, the second layer 232 made of the second metallic material can be obtained through the chemical reaction between the conductive material layer 50 and the metallic material layer 51 (refer to FIG. 2C).

[The Conditions for Formation of the Conductive Material Layer 50 Made of Amorphous Silicon]

used gas: $SiH_4/He/N_2$=100 sccm/400 sccm/200 sccm pressure: 70 Pa substrate temperature: 490° C.

[Process-220]

Next, the same processes as those of [Process-150] to [Process-180] of Embodiment 1 are carried out, thereby making it possible to complete the insulated gate field effect transistor of Embodiment 2.

Embodiment 3

Embodiment 3 is a change of Embodiment 1. Specifically, Embodiment 3 relates to an insulated gate field effect transistor, and a method of manufacturing the same.

Embodiment 3 is different from Embodiment 1 in that the entire gate electrode 323 is made of a nickel silicide 332. In addition, Embodiment 3 is also different from Embodiment 1 in a method of forming the gate electrode 323. Hereinafter, a method of manufacturing an insulated gate field effect transistor of Embodiment 3 will be described in detail with reference to FIGS. 3A to 3D.

[Process-300]

Firstly, the same processes as those of [Process-100] and [-110] of Embodiment 1 are carried out.

[Process-310]

After that, the gate insulating film 30 formed on the sidewall of the opening portion 22 for gate electrode formation is selectively removed, thereby obtaining the gate insulating film 30 composed of the gate insulating film main body portion 30A and the gate insulating film extension portion 30B. In this case, the gate insulating film main body portion 30A is left on the bottom portion of the opening portion 22 for gate electrode formation. Also, the gate insulating film extension portion 30B extends from the gate insulating film main body portion 30A to the middle of the sidewall of the opening portion 22 for gate electrode formation. Specifically, after the resist layer (not shown) is formed over the entire surface of the base 10 similarly to the case of [Process-130] of Embodiment 1, the etch back is performed for the resist layer to leave the resist layer on the lower portion of the opening portion 22 for gate electrode formation. Next, after a portion, of the gate insulating film 30, exposed to the upper portion of the sidewall of the opening portion 22 for gate electrode formation is removed away, the resist layer is removed. In such a manner, a state shown in FIG. 3A can be obtained.

[Process-320]

Next, the metallic material is filled in the opening portion 22 for gate electrode formation by utilizing the following method. That is to say, after the conductive material layer 50 is formed on the lower portion of the opening portion 22 for gate electrode formation, the metallic material layer 51 is formed over the entire surface of the base 10. Next, after the conductive material layer 50 and the metallic material layer 51 are caused to chemically react with each other, the unreacted metallic material layer 51 is removed. Specifically, the same process as that of [Process-210] of Embodiment 2 needs to be carried out (refer to FIGS. 3B to 3D).

[Process-330]

Next, the same processes as those of [Process-150] to [Process-180] of Embodiment 1 are carried out, thereby making it possible to complete the insulated gate field effect transistor of Embodiment 3.

Embodiment 4

Embodiment 4 is also a change of Embodiment 1. Specifically, Embodiment 4 relates to insulated gate field effect transistor, and a method of manufacturing the same.

Figure 4A:
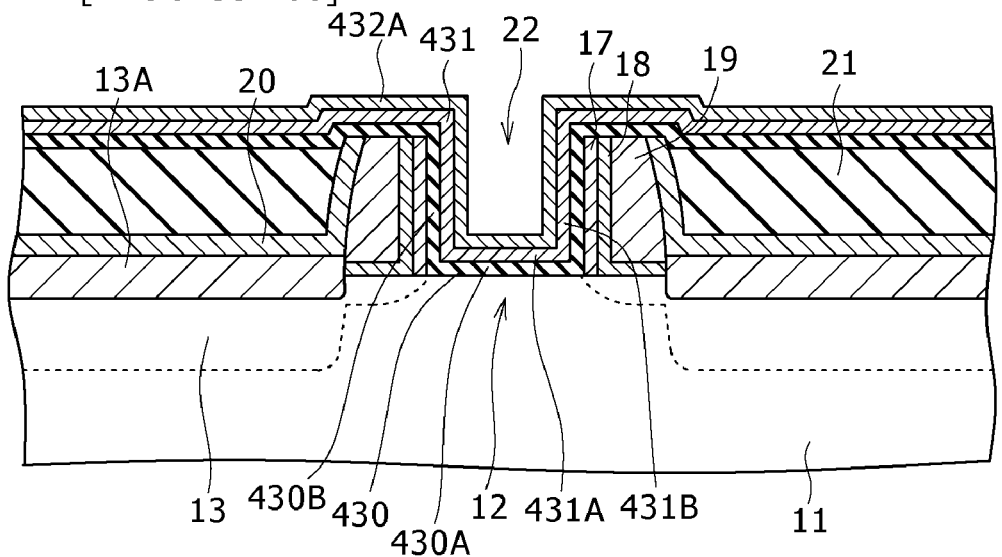
FIGS. 4A to 4F are respectively schematically partial end views, of a semiconductor substrate and the like, explaining a method of manufacturing an insulated gate field effect transistor according to Embodiment 4 of the present invention.
Figure 4B:
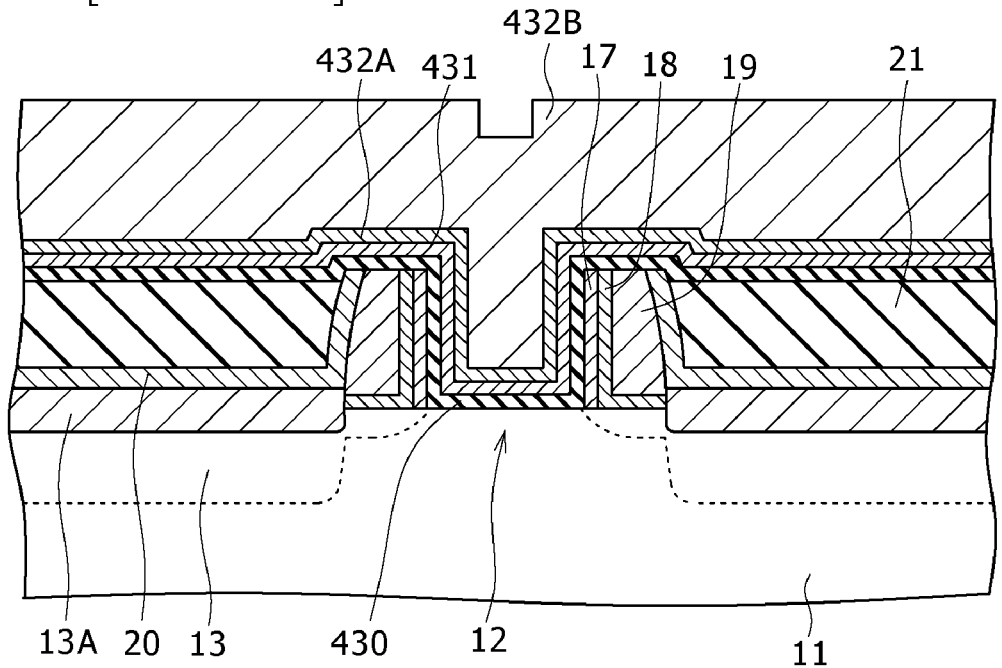
Figure 4C:
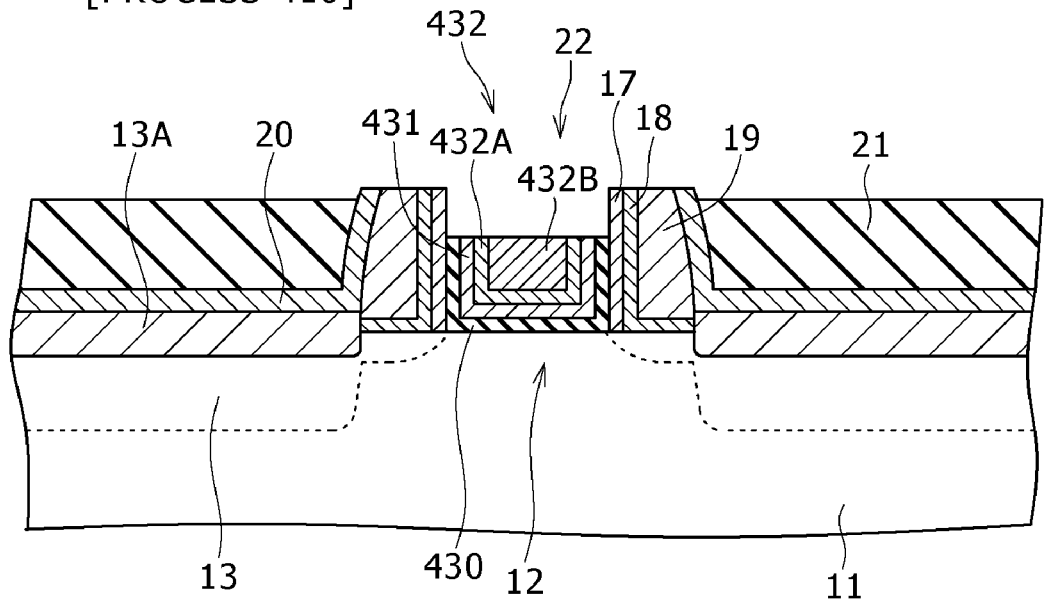
Figure 4D:
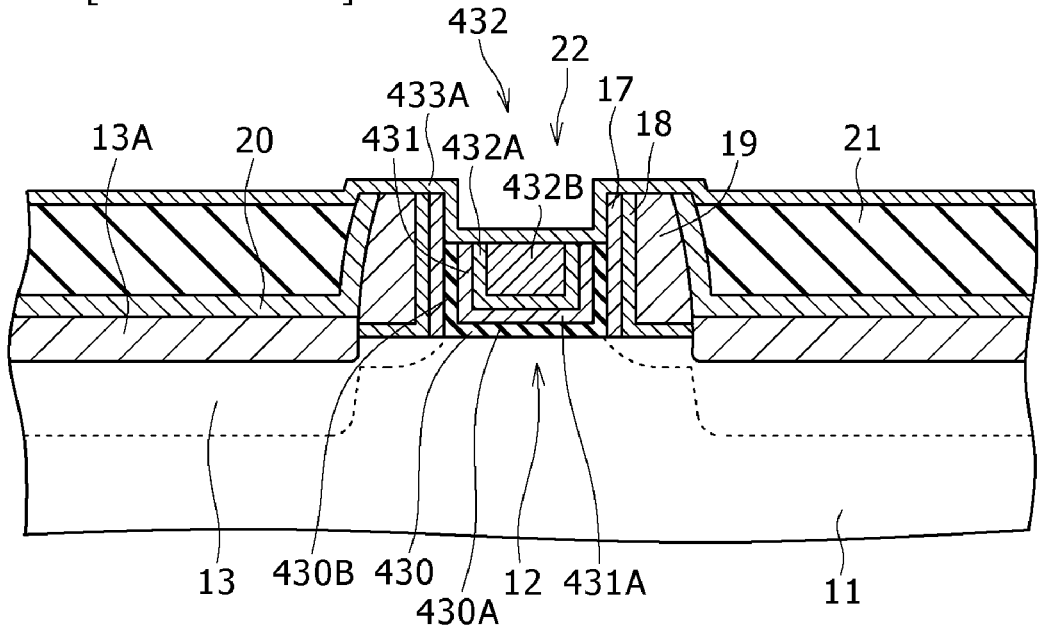
Figure 4E:
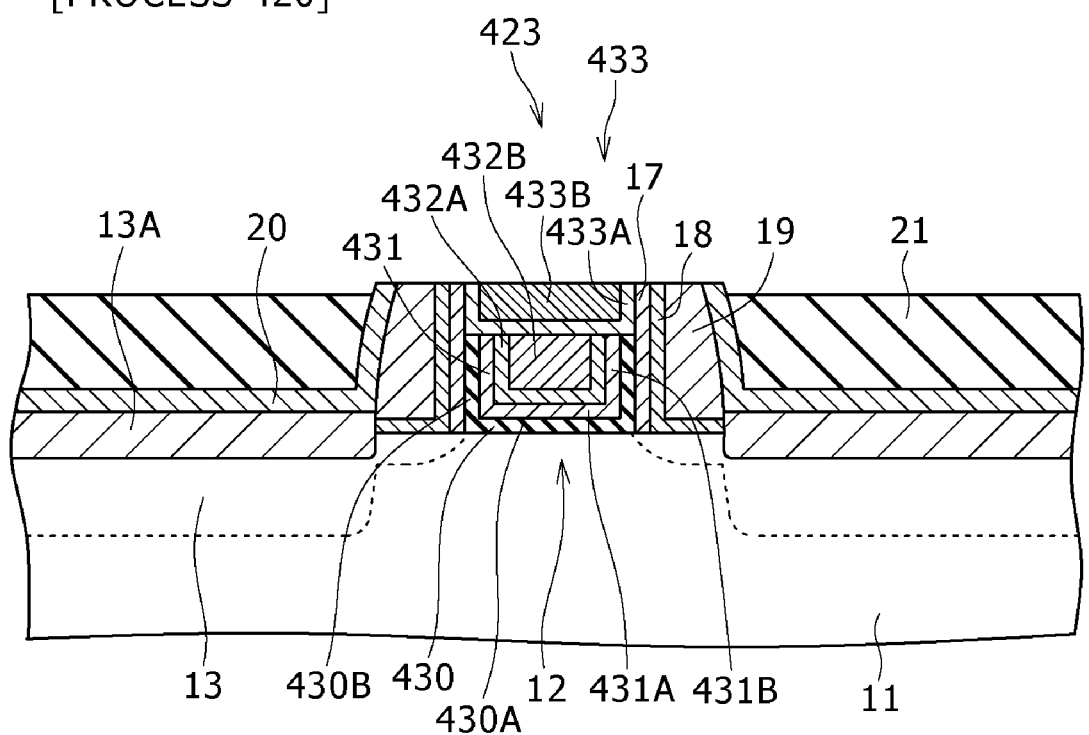
Figure 4F:
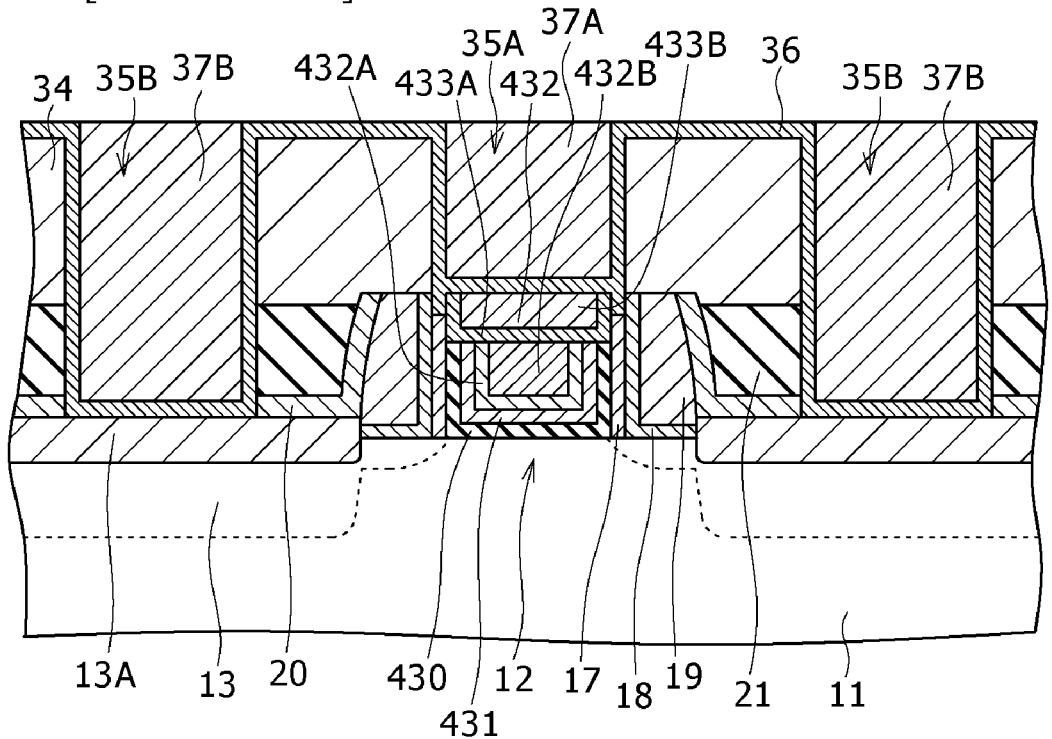
Figure 4G:
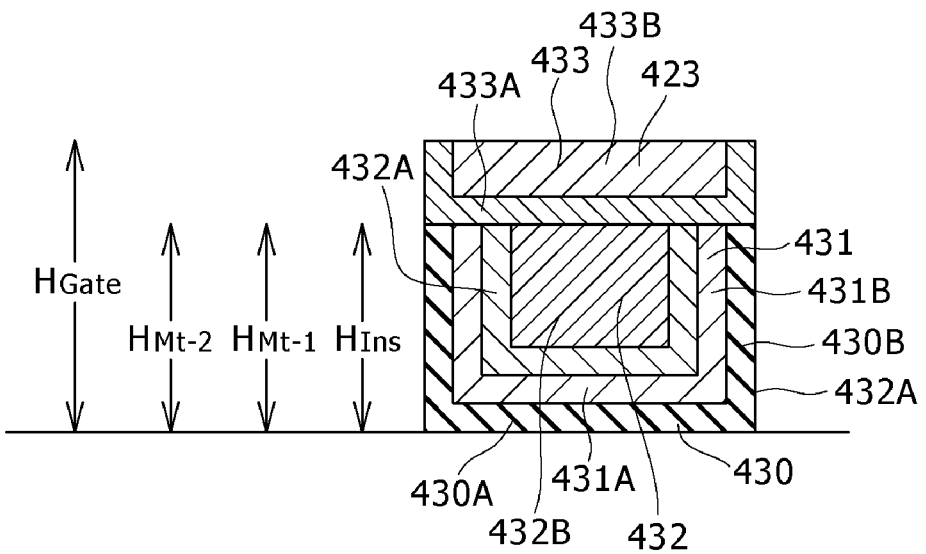
FIG. 4G is a schematically partially enlarged cross sectional view of a gate electrode and the like of the insulated gate field effect transistor according to Embodiment 4 of the present invention.

FIG. 4F shows a schematically partial end view of an insulated gate field effect transistor of Embodiment 4. Also, FIG. 4G shows a schematically partially enlarged cross sectional view of a gate electrode 423 and the like. As shown in these figures, the gate electrode 423 is composed of a first layer 431 made of a first metallic material, a second layer 423 made of a second metallic material different from the first metallic material, and a third layer 433 made of a third metallic material different from the first metallic material. Specifically, the first layer (work function controlling layer) 431 is made of the first metallic material (specifically, hafnium silicide [$HfSi_x$]) similarly to the case of Embodiment 1. In addition, the second layer 432 is composed of two layers having the thin film outer layer 432A made of TiN, and an inner layer 432B made of tungsten (W) similarly to the case of Embodiment 1. Here, the outer layer 432A functions as the barrier layer and the adhesion enhancing layer, and thus has the function as the metallic material layer (work function controlling layer) for regulating the work function of the gate electrode in the PMOS similarly to the case of Embodiment 1. However, the formation of the outer layer 432A is not essential to the insulated gate field effect transistor of Embodiment 4, and thus the second layer 432 can also be structured in the form of one layer. Moreover, the third layer 433 is also composed of two layers having an outer layer 433A functioning as the barrier layer and the adhesion enhancing layer, and an inner layer 433B made of tungsten (W).

Also, the outer layer 432A of the second layer 432 is formed in the form of a thin film layer so as to extend from a bottom surface portion, of the gate electrode 423, facing the channel formation region 12 to a middle of a side surface portion 423A of the gate electrode 423. In addition, both the second layer 432 and the third layer 433 occupy a remaining portion of the gate electrode 423 in a lamination state. Note that, when a height of the portion, of the first layer 431, formed so as to extend to the middle of the side surface portion 423A of the gate electrode 423 is $H_{Mt-1}$ and a height of an interface between the second layer 432 and the third layer 433 is $H_{Mt-2}$ with the surface of the channel formation region 12 as the reference, a relationship of $H_{Mt-1} < H_{Gate}$ and $H_{Mt-1} \approx H_{Mt-2}$ is fulfilled. Moreover, a relationship of $H_{Ins} \approx H_{Mt-1} \approx H_{Mt-2}$ is fulfilled. Note that, a portion, of the first layer 431, formed on the bottom surface portion of the gate electrode 423 is designated with reference symbol 431A, and a portion, of the first layer 431, formed so as to extend to the middle of the side surface portion 423A of the gate electrode 423 is designated with reference symbol 431B. More specifically, values of $H_{Gate}$, $H_{Ins}$, $H_{Mt-1}$, and $H_{Mt-2}$ are set as follows:

$H_{Gate} \approx 100$ nm
$H_{Ins} \approx 50$ nm
$H_{Mt-1} \approx 50$ nm
$H_{Mt-2} \approx 50$ nm Moreover, the insulated gate field effect transistor of Embodiment 4 further includes the contact plug 37A connected to the top surface of the gate electrode 423 similarly to the case of Embodiment 1. The third layer 433 exists between the bottom surface of the contact plug 37A and the upper end portion of the gate insulating film extension portion 430B.

Hereinafter, a method of manufacturing the insulated gate field effect transistor of Embodiment 4 will be described in detail with reference to FIGS. 4A to 4G.

[Process-400]

Firstly, the gate insulating film 430, the first layer 431 and the second layer 432 are formed in order both on the channel formation region 12 exposed to the bottom surface of the opening portion 22 for gate electrode formation, and on the sidewall of the opening portion 22 for gate electrode formation. Specifically, the same processes as those of [Process-100] to [Process-120] are carried out. Next, the firstly, the outer layer 432A, in the second layer 432, made of TiN, which has a thickness of 10 nm and which functions as the barrier layer is formed over the entire surface of the base 10 similarly to [Process-140] of Embodiment 1 (refer to FIG. 4A). Next, the inner layer 432B, in the second layer 432, which is made of tungsten having a thickness of 0.2 μm is formed over the entire surface of the base 10 by utilizing the blanket tungsten CVD method similarly to [Process-140] of Embodiment 1 (refer to FIG. 4B).

[Process-410]

After that time, a resist layer (not shown) is formed over the entire surface of the base 10. Also, after a portion of the gate insulating film 430, a portion of the first layer 431, and a portion of the second layer 432 which are formed on the upper portion of the sidewall of the opening portion 22 for gate electrode formation are removed away by utilizing the etch back method, the resist layer is removed. Specifically, the resist layer is formed over the entire surface of the base 10, and the inner layer 432B and the outer layer 432A on the lower insulating layer 21 are removed by utilizing the etch back method. Moreover, parts of the inner layer 432B and the outer layer 432A in the second layer 432, the first layer 431 and the gate insulating film extension portion 430B in the inside of the opening portion 22 for gate electrode formation are selectively etched by utilizing the etch back method, the resist layer is removed away. The etch back using a reactive ion etching system needs to be carried out under the following conditions.

[The Etch Back Conditions for the Inner Layer 432B in the Second Layer 432]

used gas: $SF_6$=100 sccm
pressure: 1.3 Pa (10 mTorr)
power: upper electrode/lower electrode=800 W/20 W

[The Etch Back Conditions for the Outer Layer 432A in the Second Layer 432, the First Layer 431, and the Gate Insulating Film Extension Portion 430B]

used gas: $Cl_2/BCl_3$/Ar=70 sccm/30 sccm/100 sccm
pressure: 0.8 Pa (6 mTorr)
power: upper electrode/lower electrode=800 W/100

In such a manner, it is possible to obtain the gate electrode 430 composed of the gate insulating film main body portion 430A and the gate insulating film extension portion 430B, the first layer 431, and the second layer 432 (composed of the inner layer 432B and the outer layer 432A) (refer to FIG. 4C). In this case, the gate insulating film main body portion 430A is left on the bottom portion of the opening portion 22 for gate electrode formation, and the gate insulating film extension portion 430B extends from the gate insulating film main body portion 430A to the middle of the sidewall of the opening portion 22 for gate electrode formation. The first layer 431 is formed so as to extend from the bottom surface portion of the gate electrode 423 facing the channel formation region 12 to the middle of the side surface portion 423A of the gate electrode 423. Also, the second layer 432 is filled in the portion, having the first layer 431 formed therein, within the opening portion 22 for gate electrode for gate electrode formation.

[Process-420]

After that time, the third metallic material is filled in the remaining portion of the opening portion 22 for gate electrode formation. More specifically, the outer layer 433A, made of TiN, which functions as the barrier layer is formed over the entire surface of the base 10 similarly to [Process-140] of Embodiment 1 (refer to FIG. 4D). The outer layer 433A having a thickness of 10 nm in the third layer can be formed by utilizing either the CVD method or the PVD method such as the sputtering method or the ALD method (alternately using an $NH_3$ gas and a $TiCl_4$ gas).

Next, the inner layer 433B, made of tungsten, which has a thickness of 0.2 μm in the third layer 433 is formed over the entire surface of the base 10 by utilizing the blanket tungsten CVD method similarly to [Process-140] of Embodiment 1. Thereafter, the flattening treatment is carried out by utilizing the CMP method, thereby removing portions, of the inner layer 433B and the outer layer 433A, overlying the lower insulating layer 21, the offset spacer 17, the first sidewall 18 and the second sidewall 19 (refer to FIG. 4E). As a result, it is possible to obtain the gate insulating film 423 composed of the third layer 433 composed of the two layers having the outer layer 433A and the inner layer 433B, the second layer 432 composed of the two layers having the outer layer 432A and the inner layer 432B, and the first layer 431. Here, none of the first layer 431 and the gate insulating film 430 is exposed to the top surface of the gate electrode 423.

[Process-430]

Next, the same processes as those of [Process-150] to [Process-180] of Embodiment 1 are carried out, thereby making it possible to complete the insulated gate field effect transistor of Embodiment 4 (refer to FIGS. 4F and 4G). Here, the third layer 433 exists between the bottom surface of the contact plug 37A and the upper end portion of the gate insulating film extension portion 430B.

Embodiment 5

Embodiment 5 relates to an insulated gate field effect transistor, and a method of manufacturing the same.

Figure 5A:
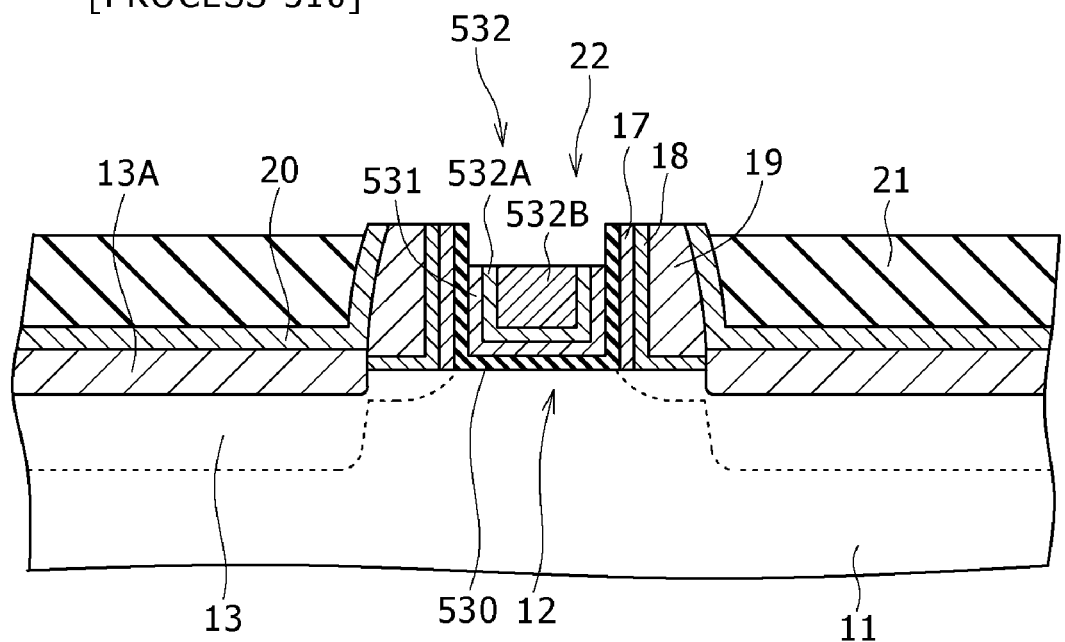
FIGS. 5A to 5D are respectively schematically partial end views, of a semiconductor substrate and the like, explaining a method of manufacturing an insulated gate field effect transistor according to Embodiment 5 of the present invention.
Figure 5B:
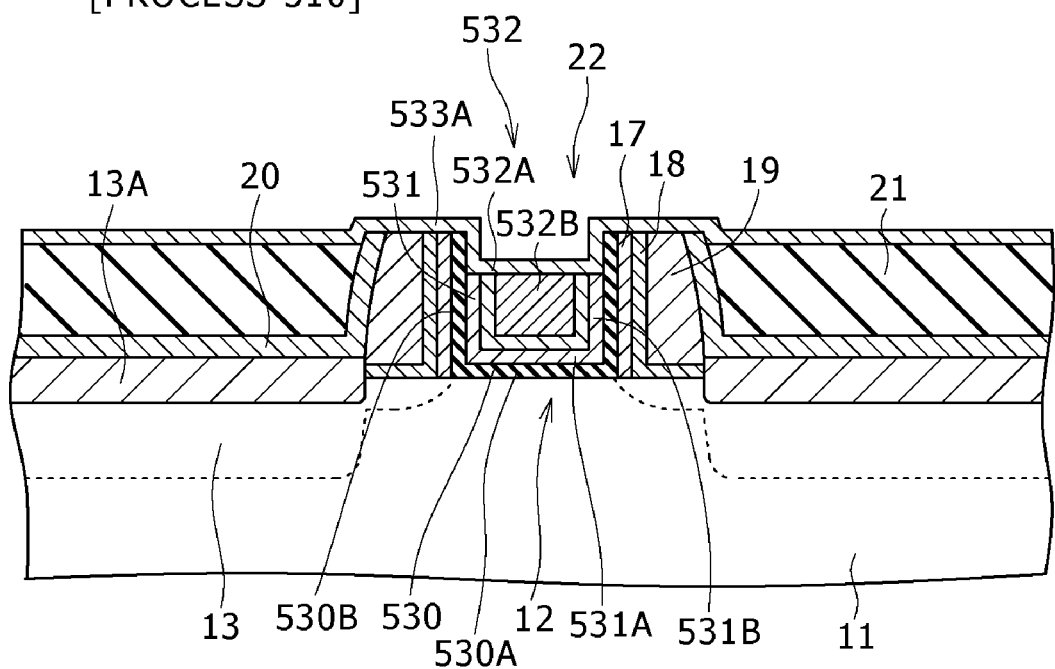
Figure 5C:
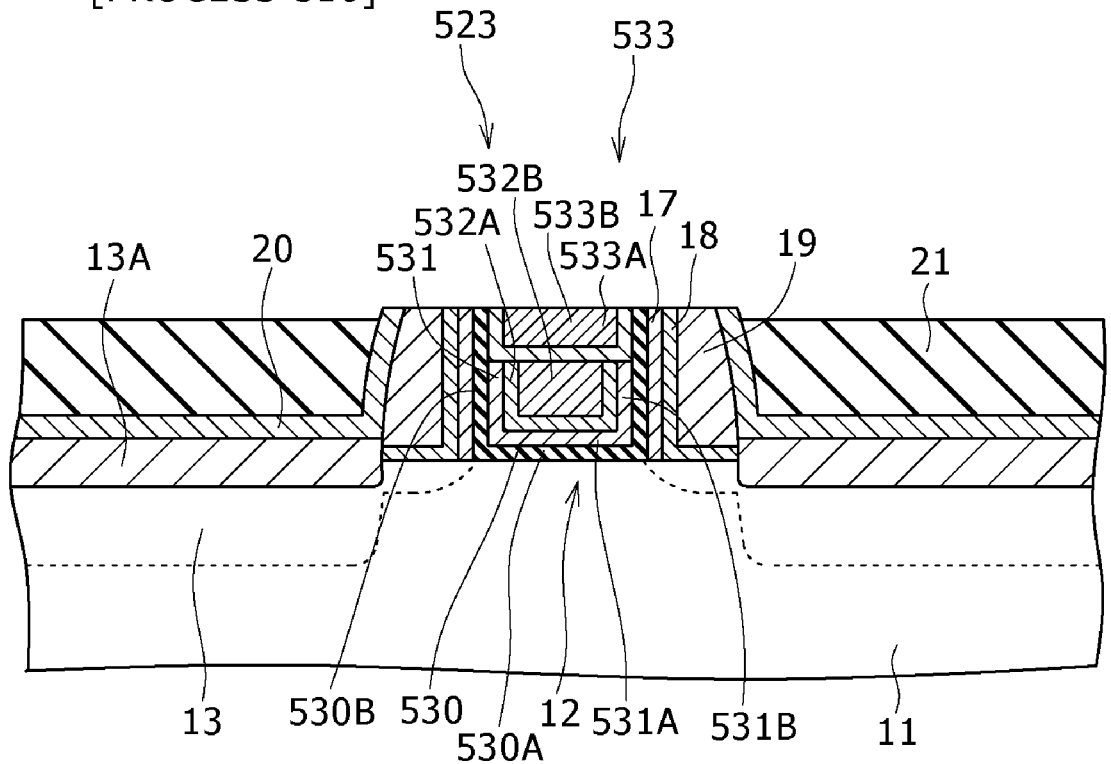
Figure 5D:
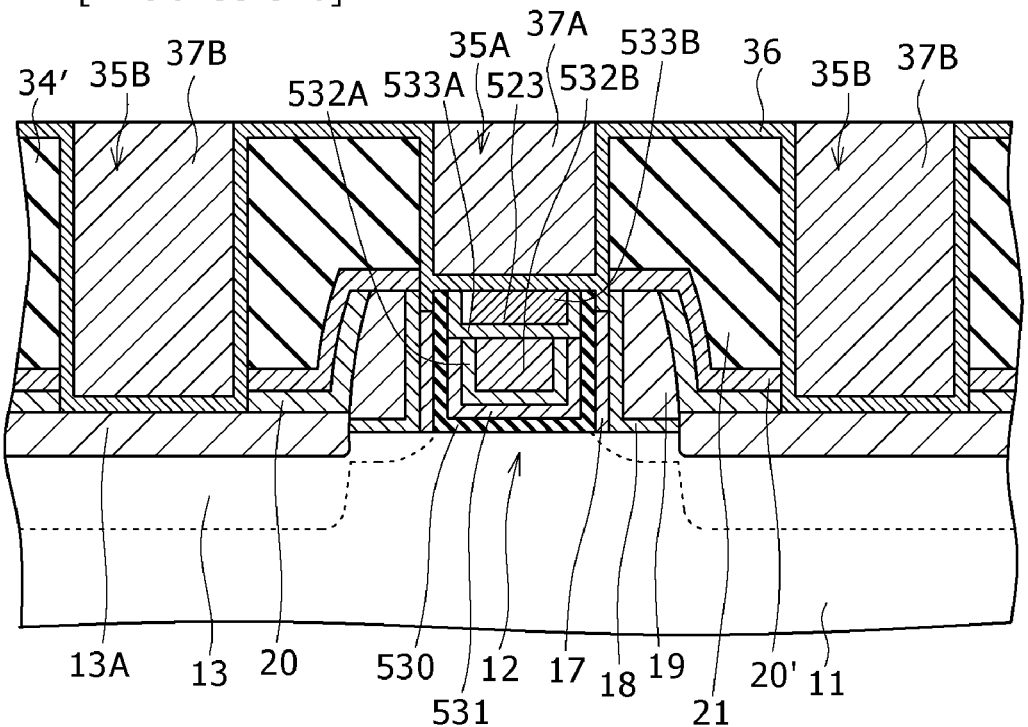
Figure 5E:
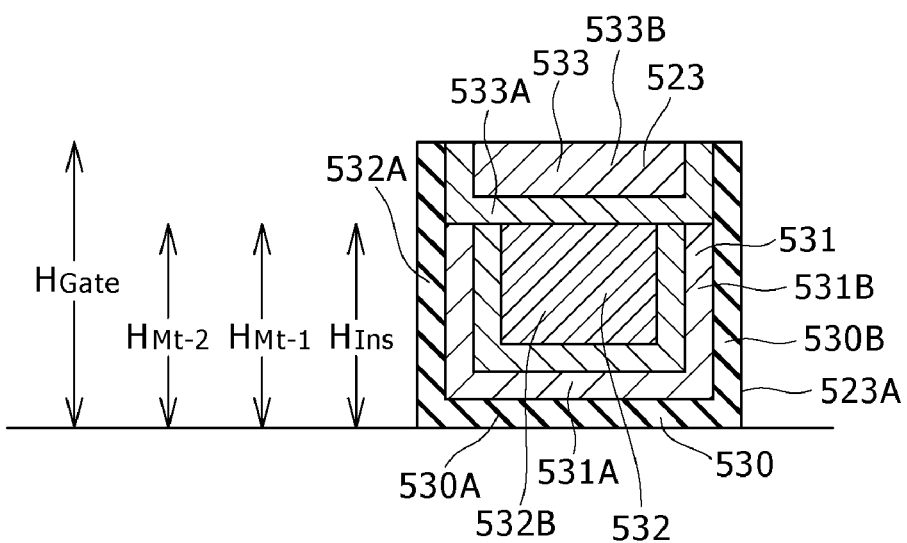
FIG. 5E is a schematically partially enlarged cross sectional view of a gate electrode and the like of the insulated gate field effect transistor according to Embodiment 5 of the present invention.
Figure 6A:
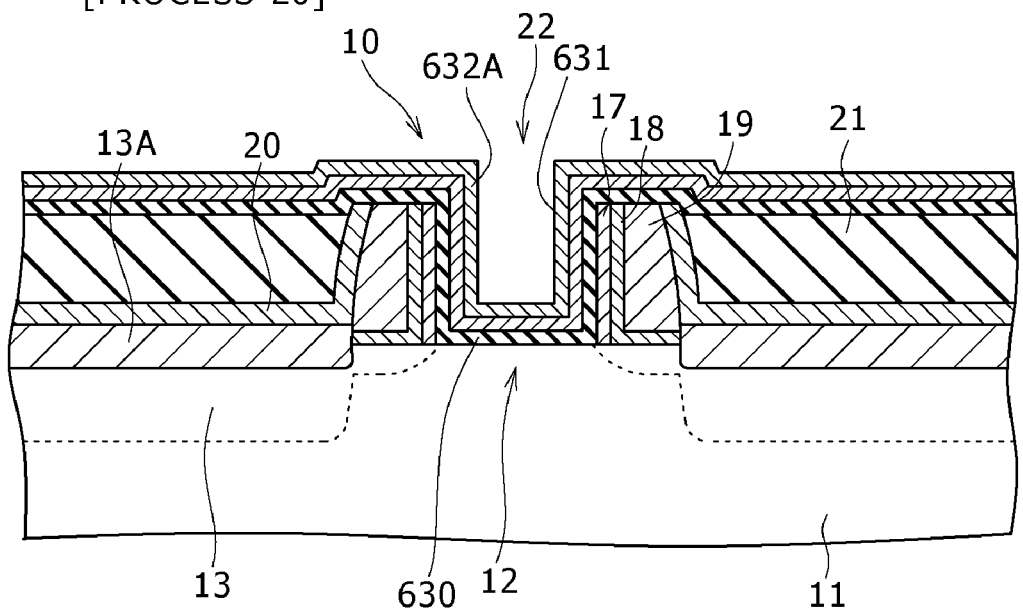
FIGS. 6A to 6H are respectively schematically partial end views, of a semiconductor substrate and the like, explaining a method of manufacturing an insulated gate field effect transistor according to the related art.
Figure 6B:
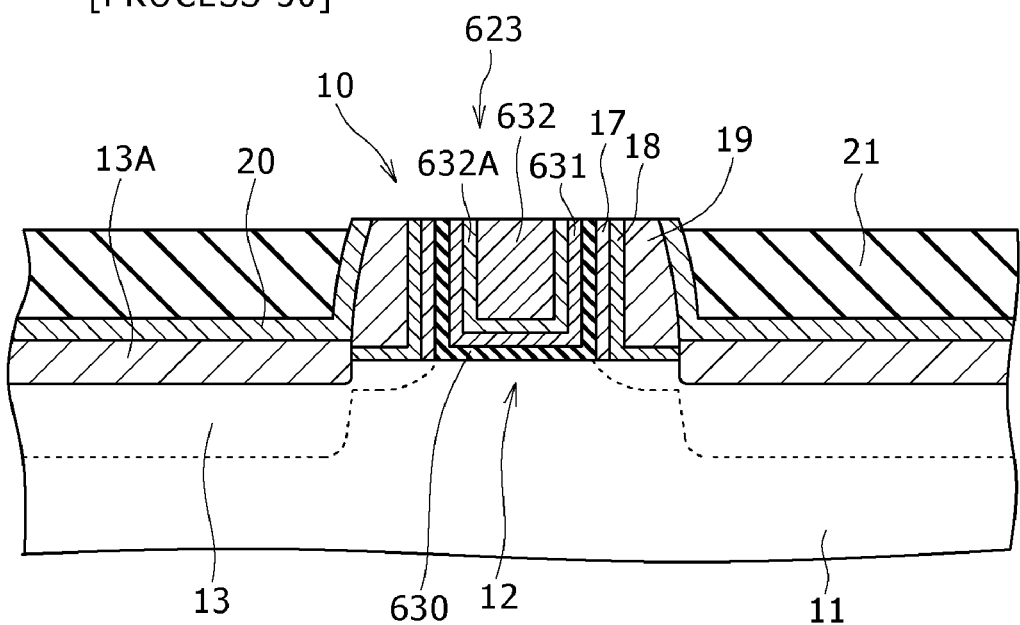
Figure 6C:
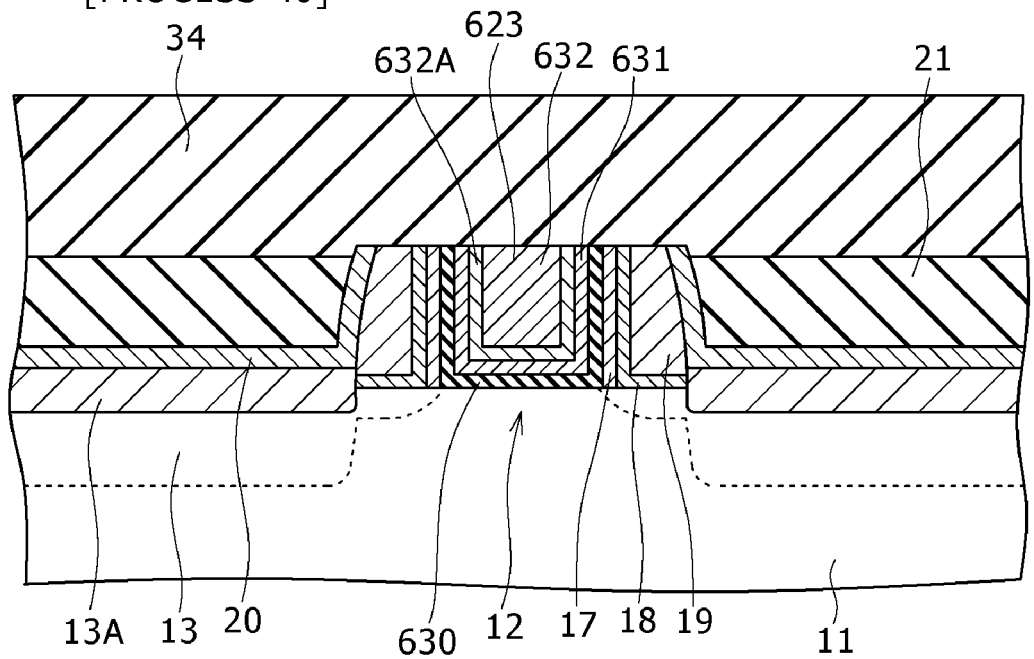
Figure 6D:
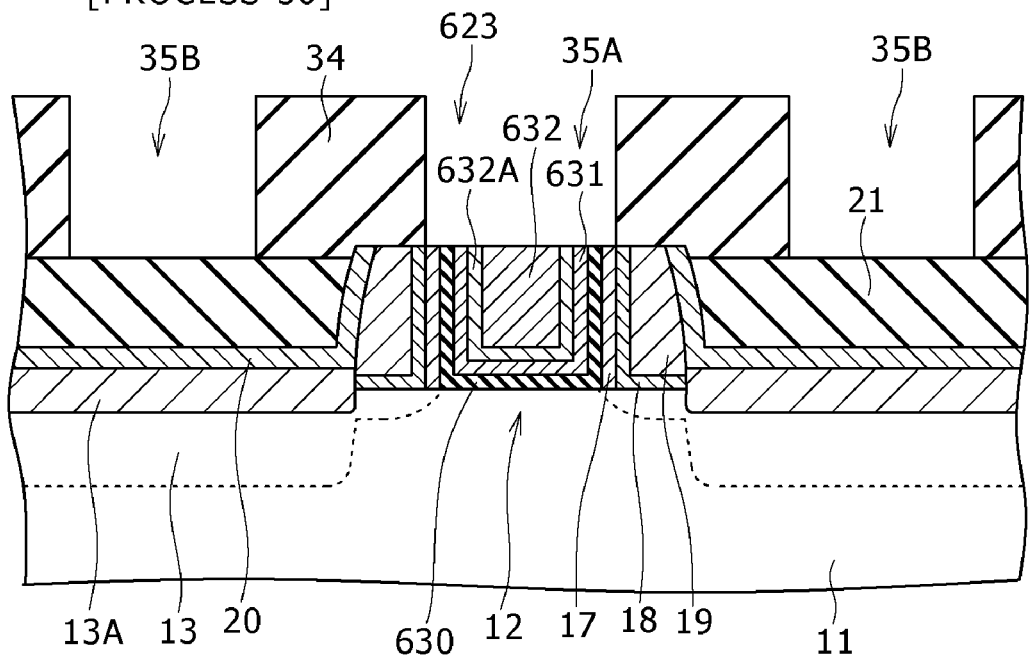
Figure 6E:
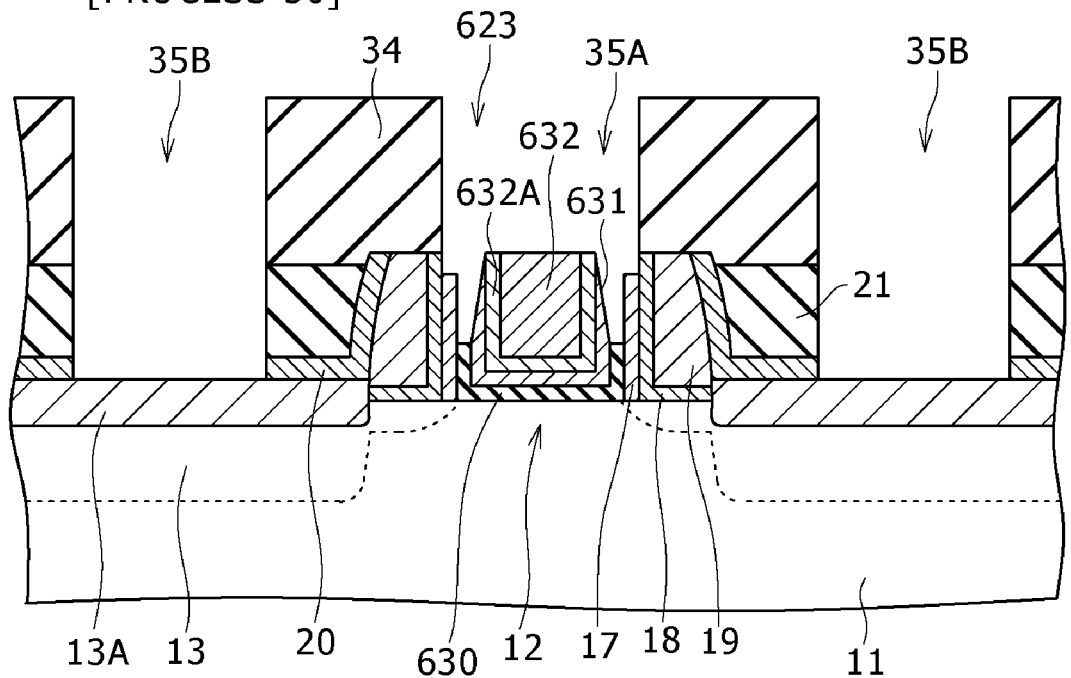
Figure 6F:
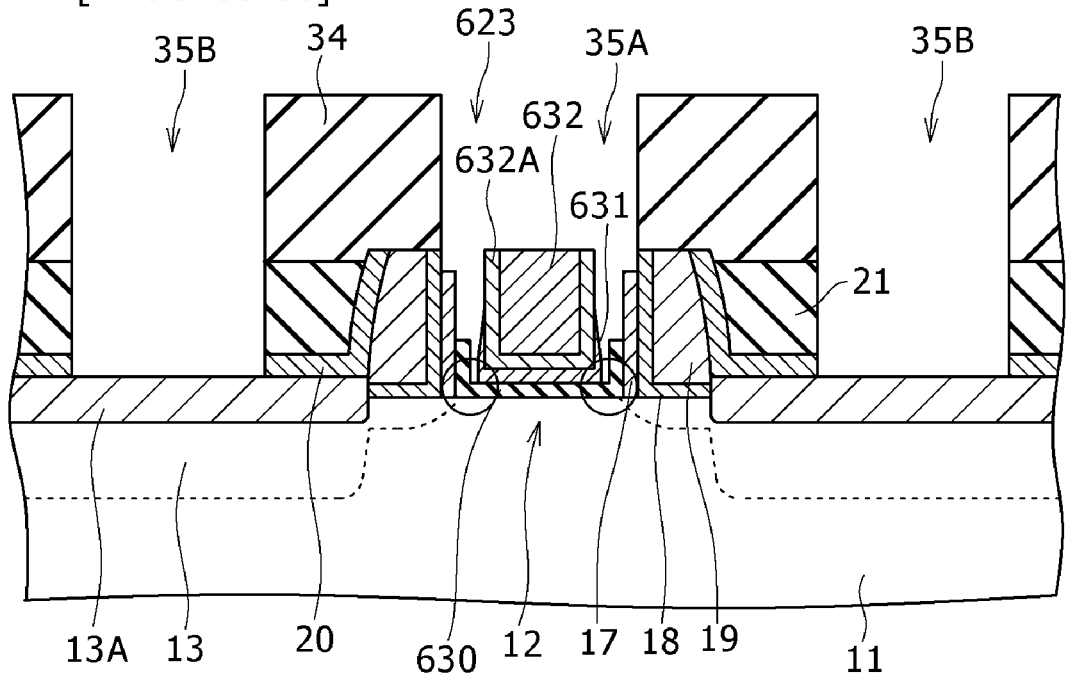
Figure 6G:
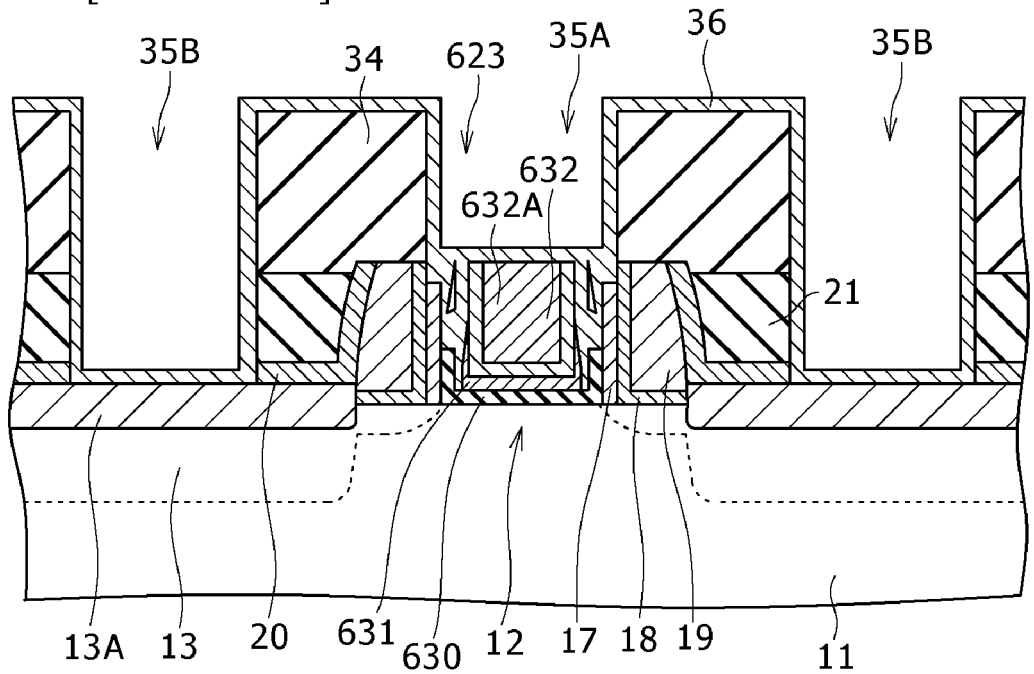
Figure 6H:
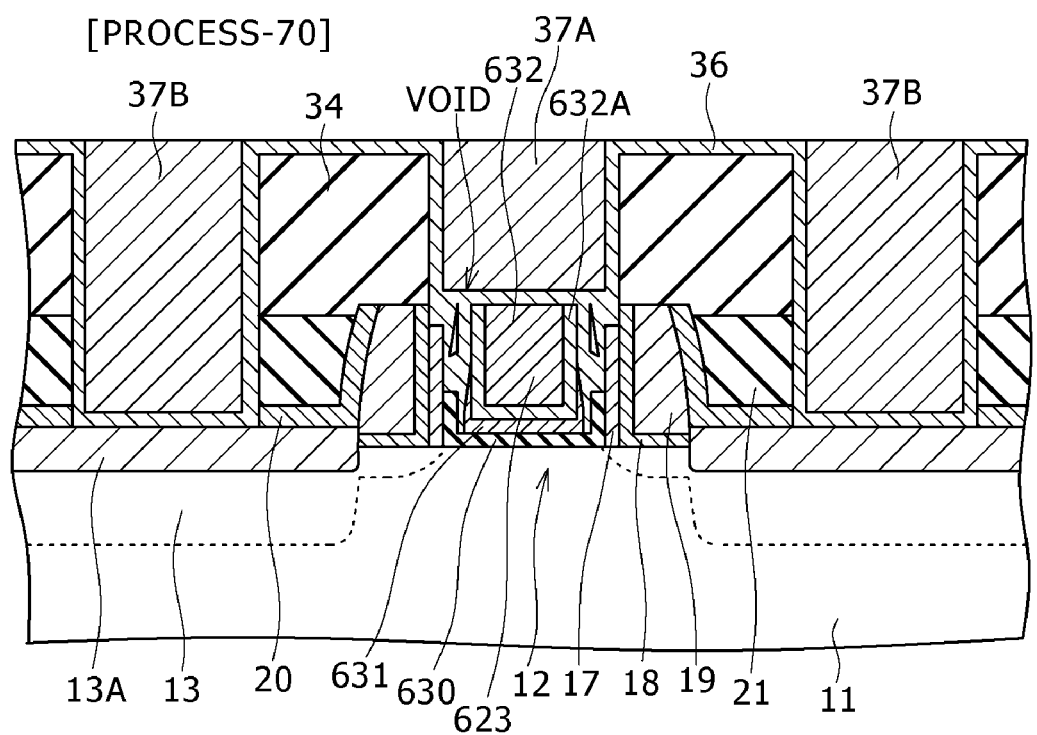

As shown in the form of a schematically partial end view in FIG. 5D, and as shown in the form of a schematically partial enlarged cross sectional view in FIG. 5E, the insulated gate field effect transistor of Embodiment 5 is one including:

(A) the source/drain region 13 and the channel formation region 12;

(B) a gate electrode 523 formed above the channel formation region 12; and (C) a gate insulating film 530.

Also, the gate insulating film 530 is composed of a gate insulating film main body portion 530A, and a gate insulating film extension portion 530B. In this case, the gate insulating film main body portion 530A is formed between the gate electrode 523 and the channel formation region 12. Also, the gate insulating film extension portion 530B extends from the gate insulating film main body portion 530A to a top surface of the gate electrode 523. In addition, the gate electrode 523 is composed of a thin film first layer 531 made of a first metallic material, a second layer 532 made of a second metallic material different from the first metallic material, and a third layer 533 made of a third metallic material different from the first metallic material. It is to be noted that the second layer 532 is composed of an outer layer 532A and an inner layer 532B, and the third layer 533 is composed of an outer layer 533A and an inner layer 533B. The constituent elements described above in the insulated gate field effect transistor of Embodiment 5 can be made substantially identical to those in the insulated gate field effect transistor of Embodiment 4.

In Embodiment 5, the first layer 531 is formed so as to extend from the bottom surface portion, of the gate electrode 523, facing the channel formation region 12 to the middle of the side surface portion 523A of the gate electrode 523. Both the second layer 532 and the third layer 533 occupy a remaining portion of the gate electrode 523 in a lamination state. In addition, as shown in FIG. 5E, when a height of the gate electrode 523 is $H_{Gate}$, a height of a portion, of the first layer 531, formed so as to extend to the middle of the side surface portion 523A of the gate electrode 523 is $H_{Mt-1}$, and a height of an interface between the second layer 532 and the third layer 533 is $H_{Mt-2}$ with the surface of the channel formation region 12 as the reference, a relationship of $H_{Mt-1} < H_{Gate}$, $H_{Mt-2} < H_{Gate}$, and $H_{Mt-1} \approx H_{Mt-2}$ is fulfilled. More specifically, not only a relationship of $0.1 \leq H_{Mt-1}/H_{Gate} \leq 0.95$ is fulfilled, but also a relationship of $(H_{Gate} - H_{Mt-1}) \geq 5$ nm is fulfilled.

In addition, the insulated gate field effect transistor of Embodiment 5 further includes the contact plug 37A connected to the top surface of the gate electrode 523. Also, the third layer 533 exists between the bottom surface of the contact plug 37A and the upper end portion of the first layer 531.

Hereinafter, a method of manufacturing the insulated gate field effect transistor of Embodiment 5 will be described in detail with reference to FIGS. 5A to 5E.

[Process-500]

Firstly, the gate insulating film 530 is formed both on the channel formation region 12 exposed to the bottom portion of the opening portion 22 for gate electrode formation, and on the sidewall of the opening portion 22 for gate electrode formation. Specifically, the same process as that of [Process-400] of Embodiment 4 is carried out. That is to say, the gate insulating film 530, the first layer 531 and the second layer 532 are formed in order both on the channel formation region 12 exposed to the bottom portion of the opening portion 22 for gate electrode formation, and on the sidewall of the opening portion 22 for gate electrode formation.

[Process-510]

After that time, the metallic material is filled in the opening portion 22 for gate electrode formation, thereby obtaining the gate electrode 523. Specifically, a resist layer (not shown) is formed over the entire surface of the base 10. After a portion of the first layer 531, and a portion of the second layer 532 which are formed on the upper portion of the sidewall of the opening portion 22 for gate electrode formation are etched by utilizing the etch back method, the resist layer is removed away. More specifically, the resist layer is formed over the entire surface of the base 10, and the inner layer 532B and the outer layer 532A on the lower insulating layer 21 are removed by utilizing the etch back method. Moreover, after parts of the inner layer 532B and the outer layer 532A in the second layer 532, and the first layer 531 in the inside of the opening portion 22 for gate electrode formation are selectively etched by utilizing the etch back method, the resist layer is removed away. It is to be noted that unlike Embodiment 4, no gate insulating film 530 is etched. The conditions of the etch back, for example, the kind of gas used in the etch back, the pressure thereof, the powers applied to an upper electrode and a lower electrode in the RIE system, respectively, the etching time, and the like are suitably selected, thereby making it possible to attain a state in which no gate insulating film 530 is etched. In such a manner, it is possible to obtain the gate electrode 530 composed of the gate insulating film main body portion 530A and the gate insulating film extension portion 530B, the first layer 531, and the second layer 532 (composed of the inner layer 532B and the outer layer 532A) (refer to FIG. 5A). In this case, the gate insulating film main body portion 530A is left on the bottom portion of the opening portion 22 for gate electrode formation, and the gate insulating film extension portion 530B extends from the gate insulating film main body portion 530A to the upper end portion of the sidewall of the opening portion 22 for gate electrode formation. The first layer 531 is formed so as to extend from the bottom surface portion of the gate electrode 523 facing the channel formation region 12 to the middle of the side surface portion 423A of the gate electrode 523. Also, the second layer 532 is filled in the portion, having the first layer 531 formed therein, within the opening portion 22 for gate electrode for gate electrode formation.

Next, the third metallic material is filled in the remaining portion of the opening portion 22 for gate electrode formation similarly to [Process-420] of Embodiment 4. As a result, it is possible to obtain the gate insulating film 523 composed of the third layer 533 composed of the two layers having the outer layer 533A and the inner layer 533B, the second layer 532 composed of the two layers having the outer layer 532A and the inner layer 532B, and the first layer 531 (refer to FIGS. 5B and 5C). Here, no first layer 531 is exposed to the top surface of the gate electrode 523.

[Process-520]

After that time, the lower insulating layer 21 is removed by utilizing the wet etching method using the dilute hydrofluoric acid.

[Process-530]

Next, after a stress liner layer 20' made of SiN is formed over the entire surface of the base 10 again, an interlayer insulating layer 34' made of $SiO_2$ is formed over the entire surface of the base 10.

[Process-540]

After that, the same processes as those of [Process-150] to [-180] of Embodiment 1 are carried out, thereby making it possible to complete the insulated gate field effect transistor of Embodiment 5 (refer to FIGS. 5D and 5E). Here, the third layer 533 exists between the bottom surface of the contact plug 37A and the upper end portion of the first layer 531.

In Embodiment 5, at a time point when [Process-510] is completed, no first layer 531 is exposed to the top surface of the gate electrode 532. Therefore, when the lower insulating layer 21 is removed by utilizing the wet etching method using the dilute hydrofluoric acid in [-520], the first layer 531 is prevented from being damaged. In addition, during formation of the opening portions 35A and 35B for contact plug formation in [Process-540], the stress liner layer 20' made of SiN, and the interlayer insulating layer 34 made of $SiO_2$ are formed above the top surface of the gate electrode 523 from the downside. Therefore, although the interlayer insulating layer 34 made of $SiO_2$ is dry-etched, and subsequently the stress liner layer 20' made of SiN is etched in order to form the opening portions 35A and 35B for contact plug formation in [Process-540], at this time, the gate insulating film 530 is prevented from being damaged. For this reason, the reliability of the resulting gate electrode 523 is prevented from being reduced. In addition, when the contact plug 37A is formed in [Process-540], the void is prevented from occurring in the contact plug 37A. Moreover, the material of the portion, located above the gate electrode 523, which is to be etched for the purpose of forming the opening portion 35A for contact plug formation, and the material of the portion, located above the source/drain region 13, which is to be etched for the purpose of forming the opening portion 35B for contact plug formation are different from each other. However, since no upper end surface of the first layer 531 is exposed to the outside, it is easy to optimize the formation conditions for the opening portions 35A and 35B for contact plug formation.

Although the present invention has been described so far based on the preferred embodiments, the present invention is not limited thereto. The structures and constitutions of the insulated gate field effect transistors described in Embodiments 1 to 5 are merely illustrated, and thus can be suitably changed. The processes for manufacturing the insulated gate field effect transistor, and the like are also merely illustrated, and thus can be suitably changed.

In Embodiment 1, the insulated gate field effect transistor is set as n-channel one. However, when the insulated gate field effect transistor is set as p-channel one, for example, the first layer needs to be made of ruthenium. Or, a method of changing the material of the gate insulating film instead of setting the work function of the gate electrode as the suitable value, thereby adjusting the value of the work function is also proposed. This method, for example, is disclosed in Japanese Patent Laid-Open No. 2006-24594. Thus, such a method can also be applied to the present invention.

In addition, in Embodiment 2 or Embodiment 3, the process may also be adopted such that in the same process as that of [Process-130] of Embodiment 1, the polysilicon layer 50 is formed on the lower portion of the opening portion 22 for gate electrode formation instead of forming the resist layer, both the first layer 31 and the gate insulating film 30 are then etched (at this time, the polysilicon layer 50 functions as a sort of resist), and thereafter, the metallic material layer 51 is formed and is then silicidized. In addition, in Embodiment 1 to Embodiment 4 as well, the process may also be adopted such that after the gate electrode is formed, the lower insulating layer is removed by utilizing the wet etching method using a hydrofluoric acid, the stress liner layer made of SiN is then formed over the entire surface of the base again, and moreover the interlayer insulating layer made of $SiO_2$ is formed over the entire surface of the base.

It should be understood by those skilled in the art that various modifications, combinations, sub-combinations and alterations may occur depending on design requirements and other factors insofar they are within the scope of the appended claims or the equivalents thereof.

What is claimed is:

1. An insulated gate field effect transistor comprising:
   (A) a source/drain region and a channel formation region;
   (B) a gate electrode formed above said channel formation region;
   (C) sidewall spacers between which said gate electrode is located; and
   (D) a gate insulating film;
   wherein,
   said gate electrode is composed of a first layer made of a first metallic material, a second layer made of a second metallic material different from the first metallic material, and a third layer made of a third metallic material different from the first metallic material,
   said first layer extends from a bottom surface portion of said gate electrode facing said channel formation region to a height $H_{Mt-1}$ along said side surface of said gate electrode,
   said second layer and said third layer occupy a remaining portion of said gate electrode in a lamination state.
   a height of an interface between said second layer and said third layer is $H_{Mt-2}$ with said surface of said channel formation region as the reference,
   $H_{Mt-1}<H_{Gate}$, and $H_{mt-1}\approx H_{Mt-2}$,
   said gate insulating film is composed of a gate insulating film main body portion formed between said gate electrode and said channel formation region, and gate insulating film extension portion extending from said insulating film main body portion along side surface of said gate electrode,
   a height of said gate electrode is $H_{Gate}$ and a height of said gate insulating film extension portion is $H_{Ins}$ with a surface of said channel formation region as a reference,
   $K_{Ins}<H_{Gate}$, and
   above $H_{Ins}$ said gate electrode extends out to said sidewall spacers.

2. The insulated gate field effect transistor according to claim 1, wherein:
   said gate electrode is composed of a first layer made of a first metallic material, and a second layer made of a second metallic material different from the first metallic material;
   said first layer is formed so as to extend from a bottom surface portion of said gate electrode facing said channel formation region to a height $H_{Mt-1}$ along said side surface of said gate electrode;
   said second layer occupies a remaining portion of said gate electrode; and
   $H_{Mt-1}<H_{Gate}$.

3. The insulated gate field effect transistor according to claim 2, further comprising:
   a contact plug connected to a top surface of said gate electrode,
   wherein,
   said second layer exists between a bottom surface of said contact plug and an upper end portion of said gate insulating film extension portion.

4. The insulated gate field effect transistor according to claim 2, wherein:
   said second layer is composed of two layers having an outer layer and an inner layer;
   said outer layer of said second layer extends from a surface of said first layer along said side surface of said gate electrode; and
   said inner layer of said second layer occupies a remaining portion of said gate electrode.

5. The insulated gate field effect transistor according to claim 4, further comprising:
   a contact plug connected to a top surface of said gate electrode,
   wherein,
   at least one of said inner layer and said outer layer exists between a bottom surface of said contact plug and an upper end portion of said gate insulating film extension portion.

6. The insulated gate field effect transistor according to claim 1, further comprising:
   a contact plug connected to a top surface of said gate electrode,
   wherein,
   said third layer exists between a bottom surface of said contact plug and an upper end portion of said gate insulating film extension portion.

7. The insulated gate field effect transistor according to claim 1, wherein $0.1 \leq H_{Ins}/H_{Gate} \leq 0.95$, and $(H_{Gate}-H_{Ins}) \geq 5$ nm.

8. The insulated gate field effect transistor according to claim 1, wherein:
   $H_{Ins} \approx H_{Mt-1} \approx H_{Mt-2}$.

9. An insulated gate field effect transistor comprising:

(A) a source/drain region and a channel formation region;

(B) a gate electrode formed above said channel formation region;

(C) sidewalls between which the gate electrode is located; and (D) a gate insulating film;

wherein, said gate electrode is composed of a first layer made of a first metallic material, a second layer made of a second metallic material different from the first metallic material, and a third layer made of a third metallic material different from the first metallic material, said first layer extends from a bottom surface portion of said gate electrode facing said channel formation region to a height $H_{Mt-1}$ along said side surface of said gate electrode, said second layer and said third layer occupy a remaining portion of said gate electrode in a lamination state;

a height of an interface between said second layer and said third layer is $H_{M-2}$ with said surface of said channel formation region as the reference, said gate insulating film is composed of a gate insulating film main body portion formed between said gate electrode and said channel formation region, and a gate insulating film extension portion extending from said insulating film main body portion to a top surface of said gate electrode, said gate insulating film defining a volume, said gate insulating film is between said gate electrode and a top surface of said channel formation region and between said gate electrode and said sidewall spacers, said gate electrode is composed of a first layer made of a first metallic material, a second layer made of a second metallic material different from the first metallic material, and a third layer made of a third metallic material different from the first metallic material, said first layer extends from a bottom surface of said gate electrode facing said channel formation region to a height $H_{Mt-1}$ along side surfaces of said gate insulating layer extension, said first layer and said second layer occupy said volume defined by said gate insulating film, said second layer and said third layer occupy a remaining portion of said gate electrode in a lamination state, a height of said gate electrode is $H_{Gate}$, a height of an interface between said second layer and said third layer is $H_{Mt-2}$ with a surface of said channel formation region as a reference, said interface extends across said entire gate electrode, and $H_{Mt-1} < H_{Gate}$, $H_{Mt-2} < H_{Gate}$, and $H_{Ins} \approx H_{Mt-1} \approx H_{Mt-2}$.

10. The insulated gate field effect transistor according to claim 9, further comprising:

a contact plug connected to a top surface of said gate electrode, wherein, said third layer exists between a bottom surface of said contact plug and an upper end portion of said first layer.

11. The insulated gate field effect transistor according to claim 9, wherein $0.1 \leq H_{Mt-1}/H_{Gate} \leq 0.95$ and $(H_{Gate} - H_{Mt-1}) \geq 5$ nm.

* * * * *